US012684812B2

(12) United States Patent
Lu et al.

(10) Patent No.: US 12,684,812 B2
(45) Date of Patent: Jul. 14, 2026

(54) METHODS FOR FABRICATING SEMICONDUCTOR DEVICE HAVING NANOSTRUCTURE TRANSISTOR WITH CAP LAYER

(71) Applicant: TAIWAN SEMICONDUCTOR MANUFACTURING COMPANY, LTD., Hsinchu (TW)

(72) Inventors: Yen-Sheng Lu, Miaoli (TW); Chung-Chi Wen, Taipei (TW); Yen-Ting Chen, Taichung (TW); Wei-Yang Lee, Taipei (TW); Chia-Pin Lin, Hsinchu (TW); Chih-Chiang Chang, Hsinchu (TW); Chien-I Kuo, Chiayi (TW); Yuan-Ching Peng, Hsinchu (TW); Chih-Ching Wang, Kinmen (TW); Wen-Hsing Hsieh, Hsinchu (TW); Chii-Horng Li, Hsinchu (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 670 days.

(21) Appl. No.: 17/732,552

(22) Filed: Apr. 29, 2022

(65) Prior Publication Data

US 2023/0352594 A1 Nov. 2, 2023

(51) Int. Cl.
*H10D 30/67* (2025.01)
*H10D 30/01* (2025.01)
*H10D 62/10* (2025.01)
*H10D 64/01* (2025.01)
*H10P 14/20* (2026.01)

(52) U.S. Cl.
CPC ....... *H10D 30/6713* (2025.01); *H10D 30/031* (2025.01); *H10D 30/6735* (2025.01);
(Continued)

(58) Field of Classification Search
CPC .......... H01L 29/78618; H01L 21/0259; H01L 29/0665; H01L 29/42392; H01L 29/66545;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 202044417 A 12/2020
TW 202109636 A 3/2021
(Continued)

*Primary Examiner* — Norman D Richards
*Assistant Examiner* — Laura M Dykes
(74) *Attorney, Agent, or Firm* — NZ Carr Law Office

(57) ABSTRACT

Various embodiments of the present disclosure provide a semiconductor device structure. In one embodiment, the semiconductor device structure includes a source/drain feature over a substrate, a plurality of semiconductor layers over the substrate, a gate electrode layer surrounding a portion of each of the plurality of the semiconductor layers, a gate dielectric layer in contact with the gate electrode layer, and a cap layer. The cap layer has a first portion disposed between the plurality of semiconductor layers and the source/drain feature and a second portion extending outwardly from opposing ends of the first portion. The semiconductor device structure further includes a dielectric spacer disposed between and in contact with the source/drain feature and the second portion of the cap layer.

17 Claims, 32 Drawing Sheets

(52) U.S. Cl.
CPC ....... *H10D 30/6757* (2025.01); *H10D 62/118* (2025.01); *H10D 64/017* (2025.01); *H10D 64/018* (2025.01); *H10P 14/3452* (2026.01)

(58) Field of Classification Search
CPC ......... H01L 29/66553; H01L 29/66742; H01L 29/78696; H01L 29/6653; H01L 29/6656
USPC ....................................................... 257/347
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2014/0166982 | A1 | 6/2014 | Cohen et al. |
| 2018/0026033 | A1 | 1/2018 | Chang et al. |
| 2020/0266060 | A1* | 8/2020 | Cheng ................. H01L 29/0673 |
| 2020/0365692 | A1* | 11/2020 | Jung ................... H01L 29/0673 |
| 2020/0381545 | A1* | 12/2020 | Chiang .............. H01L 29/0673 |
| 2021/0028297 | A1* | 1/2021 | Yao .................... H10D 30/6757 |
| 2021/0273098 | A1* | 9/2021 | Chang ................. H10D 84/856 |

FOREIGN PATENT DOCUMENTS

| | | |
|---|---|---|
| TW | 202111809 A | 3/2021 |
| TW | 202139365 A | 10/2021 |

\* cited by examiner

100

104

106
108
106
108
106
108

109

101

105

103

107

T1

T2

100

123

123

123

123

121

119

118

101

104

106

108

106

108

106

108

109

105

103

110b

110a

110

117

107

100

138
136
134
132

130
130

C
C

A
B

D

A
B

D 125
121
119
118
101

127

106
108
106
108
106
108

104

109

105
103

117
107

(Alternative Embodiment )

(Alternative Embodiment 2)

(Alternative Embodiment 2)

(Alternative Embodiment 3)

(Alternative Embodiment 3)

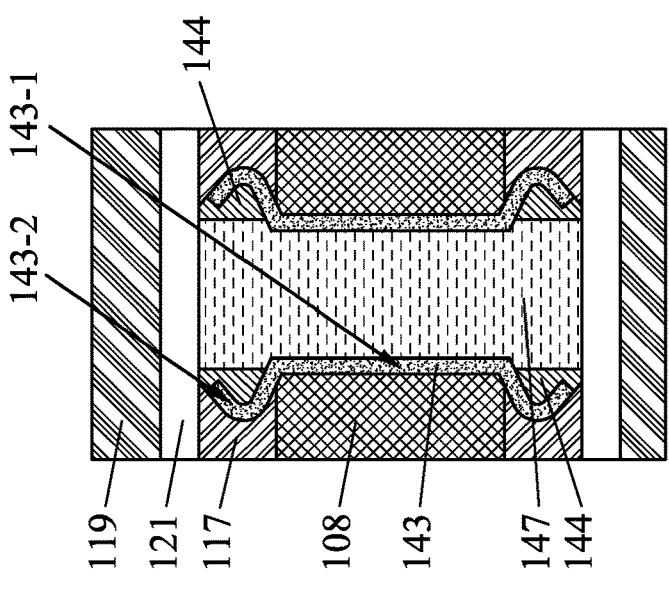
FIG. 14G
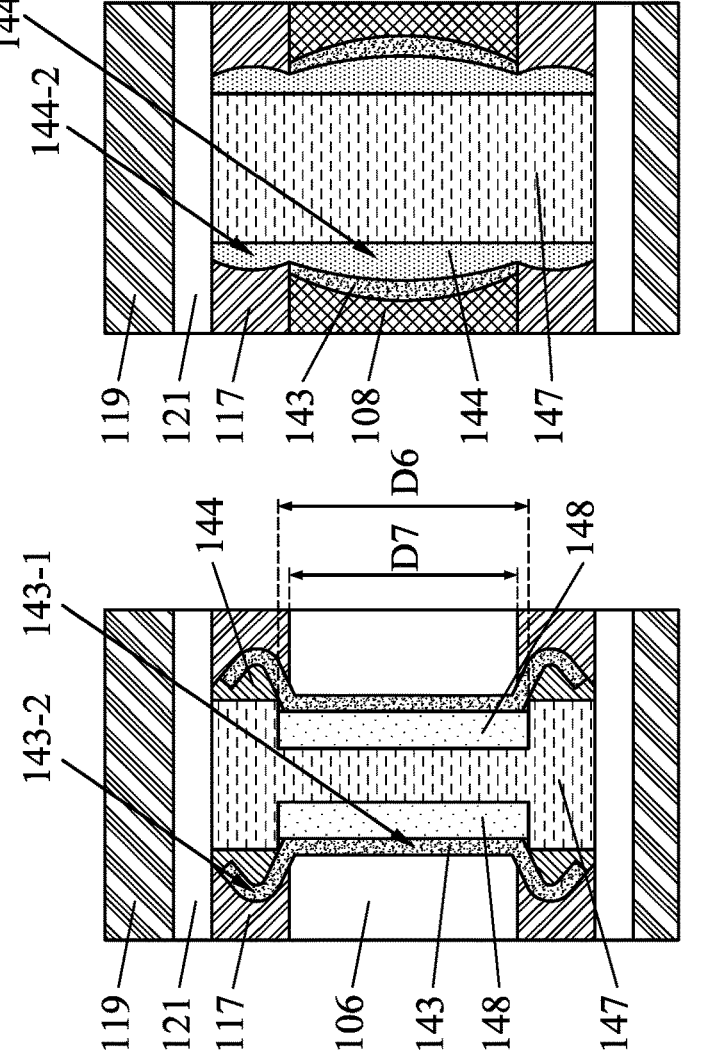
FIG. 14F
FIG. 14E (Alternative Embodiment)

(Alternative Embodiment)

(Alternative Embodiment)

(Alternative Embodiment)

(Alternative Embodiment)

(Alternative Embodiment)

METHODS FOR FABRICATING SEMICONDUCTOR DEVICE HAVING NANOSTRUCTURE TRANSISTOR WITH CAP LAYER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down presents new challenge. For example, transistors using nanostructure channels have been proposed to improve carrier mobility and drive current in a device. An inner spacer is often disposed between metal gate and source/drain (S/D) structure to protect the S/D structure from damage that may occur during the subsequent gate replacement process. Although the formation of the inner spacer has been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-19A are cross-sectional side views of various stages of manufacturing the semiconductor device structure taken along cross-section A-A of FIG. 5, in accordance with some embodiments.

FIGS. 6B-19B are cross-sectional side views of various stages of manufacturing the semiconductor device structure taken along cross-section B-B of FIG. 5, in accordance with some embodiments.

FIGS. 6C and 14C-19C are cross-sectional side views of various stages of manufacturing the semiconductor device structure taken along cross-section C-C of FIG. 5, in accordance with some embodiments.

FIGS. 6D and 14D-19D are cross-sectional side views of various stages of manufacturing the semiconductor device structure taken along cross-section D-D of FIG. 5, in accordance with some embodiments.

FIG. 11B-1 is an enlarged view of a portion of the semiconductor device structure of FIG. 11B in accordance with some alternative embodiments.

FIGS. 14A-1 and 14B-1 are enlarged views of a portion of the semiconductor device structure of FIGS. 14A and 14B, respectively, showing facetted structures in accordance with some embodiments.

FIG. 14E illustrates a top view of a portion of the semiconductor device structure taken along cross-section E-E of FIG. 14B, in accordance with some embodiments.

FIG. 14F illustrates a top view of a portion of the semiconductor device structure taken along cross-section F-F of FIG. 14B, in accordance with some embodiments.

FIG. 14G illustrates a portion of the semiconductor device structure taken along cross-section E-E of FIG. 14B, in accordance with some embodiments.

FIG. 22-1 is an enlarged view of a portion of the semiconductor device structure shown in FIG. 22.

FIG. 23-1 is an enlarged view of a portion of the semiconductor device structure shown in FIG. 23.

DETAILED DESCRIPTION

Figure 1:
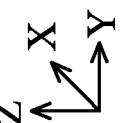
FIGS. 1-5 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 to 23-1 show exemplary processes for manufacturing a semiconductor device structure 100 according to embodiments of the present disclosure. It is understood that additional operations can be provided before, during, and after processes shown by FIGS. 1 to 23-1, and some of the operations described below can be replaced or eliminated, for additional embodiments of the method. The order of the operations/processes is not limiting and may be interchangeable.

FIGS. 1-5 are perspective views of various stages of manufacturing a semiconductor device structure 100 in accordance with some embodiments. With reference to FIG. 1, the semiconductor device structure 100 is illustrated to include a substrate 101 into which dopants have been implanted in order to form wells. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), or a combination thereof. In one embodiment, the substrate 101 is made of silicon. The substrate 101 may be doped or un-doped. The substrate 101 may be a bulk semiconductor substrate, such as a bulk silicon substrate that is a wafer, a silicon-on-insulator (SOI) substrate, a multi-layered or gradient substrate, or the like.

The substrate 101 includes a first device region 103 for forming n-type devices, such as NMOS devices (e.g., n-type gate all around transistors) and a second device region 105 for forming p-type devices, such as PMOS devices (e.g., p-type gate all around transistors). To separate the first device region 103 and the second device region 105, wells may be formed within the substrate 101 with n-type dopants and p-type dopants. To form the desired wells, the n-type dopants and the p-type dopants are implanted into the substrate 101 depending upon the devices to be formed. For example, n-type dopants such as phosphorous or arsenic may be implanted to form n-type wells, while p-type dopants such as boron may be implanted to form p-type wells. The n-type wells and p-type wells may be formed using one or more implantation techniques, such as diffusion implantations, ion implantations (e.g., plasma doping, beam line implant doping), selective implantations, deep-well implantations, and the like, or combinations thereof. Masking techniques may also be utilized to mask some regions (e.g., second device region 105) of the substrate 101 while exposing other regions (e.g., first device region 103) of the substrate 101 during a first well implantation (e.g., p-type wells) process. Once the first well implantation process has been completed, the mask is removed to expose the previously masked regions (e.g., second device region 105) and another mask may be placed over the previously exposed regions (e.g., first device region 103) during a second well implantation (e.g., n-type wells) process. In one embodiment shown in FIG. 1, the substrate 101 includes a p-type well 107 and an n-type well 109. While the first device region 103 is shown adjacent to the second device region 105, it is understood that the first device region 103 may be disposed away from the second device region 105 at different regions of the substrate 101 along the X direction or Y direction, and the first and second device regions 103, 105 belong to a continuous substrate (e.g., substrate 101).

FIG. 1 also illustrates a stack of semiconductor layers 104 formed over the substrate 101 at the first and second device regions 103, 105. The stack of semiconductor layers 104 includes semiconductor layers made of different materials to facilitate formation of nanostructure channels in a multi-gate device, such as nanostructure FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layers 106 and the second semiconductor layers 108 may vary depending on the application and/or device performance considerations. In some embodiments, each first and second semiconductor layer 106, 108 has a thickness T1, T2 of about 2 nm to about 30 nm, respectively. In other embodiments, each first and second semiconductor layer 106, 108 has a thickness T1, T2 of about 10 nm to about 20 nm. The thickness T1 of the first semiconductor layer 106 may be equal to, less than, or greater than the thickness of the thickness T2 of the second semiconductor layer 108. The second semiconductor layers 108 may eventually be removed and serve to define a vertical distance between adjacent channels for the semiconductor device structure 100.

The first semiconductor layers 106 or portions thereof may form nanostructure channel(s) of the semiconductor device structure 100 in later fabrication stages. The term "nanostructure" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanowire transistors, nanosheet transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a vapor-phase epitaxy (VPE), a molecular beam epitaxy (MBE) process, a metalorganic chemical vapor deposition (MOCVD) process, and/or other suitable growth processes, such as chemical vapor deposition (CVD), low pressure CVD (LPCVD), atomic layer CVD (ALCVD), ultra-high vacuum CVD (UHVCVD), reduced pressure CVD (RPCVD), a combination thereof, or the like. While three first semiconductor layers 106 and three second semiconductor layers 108 are alternately arranged as illustrated in FIG. 1, any number of first and second semiconductor layers 106, 108 can be formed in the stack of semiconductor layers 104, depending on the predetermined number of nanostructure channels for each FET. For example, the number of first semiconductor layers 106, which is the number of channels, may be between 2 and 8.

Figure 2:
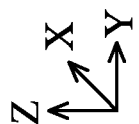

In FIG. 2, fin structures 112 are formed from the stack of semiconductor layers 104, and an insulating material 118 is formed in the trenches 114 between the fin structures 112. Each fin structure 112 has a portion including the semiconductor layers 106, 108, a portion of the wells 107, 109, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer. The hard mask 110b may be a nitrogen-containing layer. The fin structures 112 may be fabricated using suitable processes including photolithography and etch processes. In some embodiments, the photolithography process may include forming a photoresist layer (not shown) over the mask structure 110, exposing the photoresist layer to a pattern, performing post-exposure bake processes, and developing the photoresist layer to form a patterned photoresist layer. The patterned photoresist layer may then be used to protect regions of the substrate 101 and layers formed thereupon, while an etch process forms trenches 114 in unprotected regions through the mask structure 110, the stack of semiconductor layers 104, and into the wells 107, 109 of the substrate 101, thereby forming the extending fin structures 112. A width W1 of the fin structures 112 at the first device region 103 along the Y direction may be in a range between about 3 nm and about 44 nm. A width W2 of the fin structures 112 at the second device region 105 along the Y direction may be equal to, less than, or greater than the width W1. The trenches 114 may be etched using a dry etch (e.g., RIE), a wet etch, and/or combination thereof. While two fin structures 112 are shown, the number of the fin structures is not limited to two.

After the fin structures 112 are formed, the insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures

112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as LPCVD, plasma enhanced CVD (PECVD) or flowable CVD (FCVD). Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layer 108 in contact with the wells 107, 109.

Figure 3:

In FIG. 3, a cladding layer 117 is formed over exposed portion of the fin structures 112. The cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 are to be removed subsequently to create space for the subsequently formed gate electrode layer. A liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 2) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer 106. For example, in some embodiments, after the recess process, the top surfaces of the liner 119 and the dielectric material 121 may be level with a top surface of the uppermost first semiconductor layer 106. The recess processes may be selective etch processes that do not substantially affect the semiconductor material of the cladding layer 117. As a result of the recess process, trenches 123 are formed between the fin structures 112 (FIG. 2).

Figure 4:
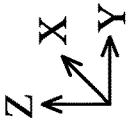

In FIG. 4, a dielectric material 125 is formed in the trenches 123 (FIG. 3) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequently formed source/drain (S/D) epitaxial features and adjacent gate electrode layers.

Figure 5:
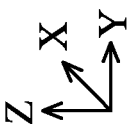
Figures 6A, 6B:
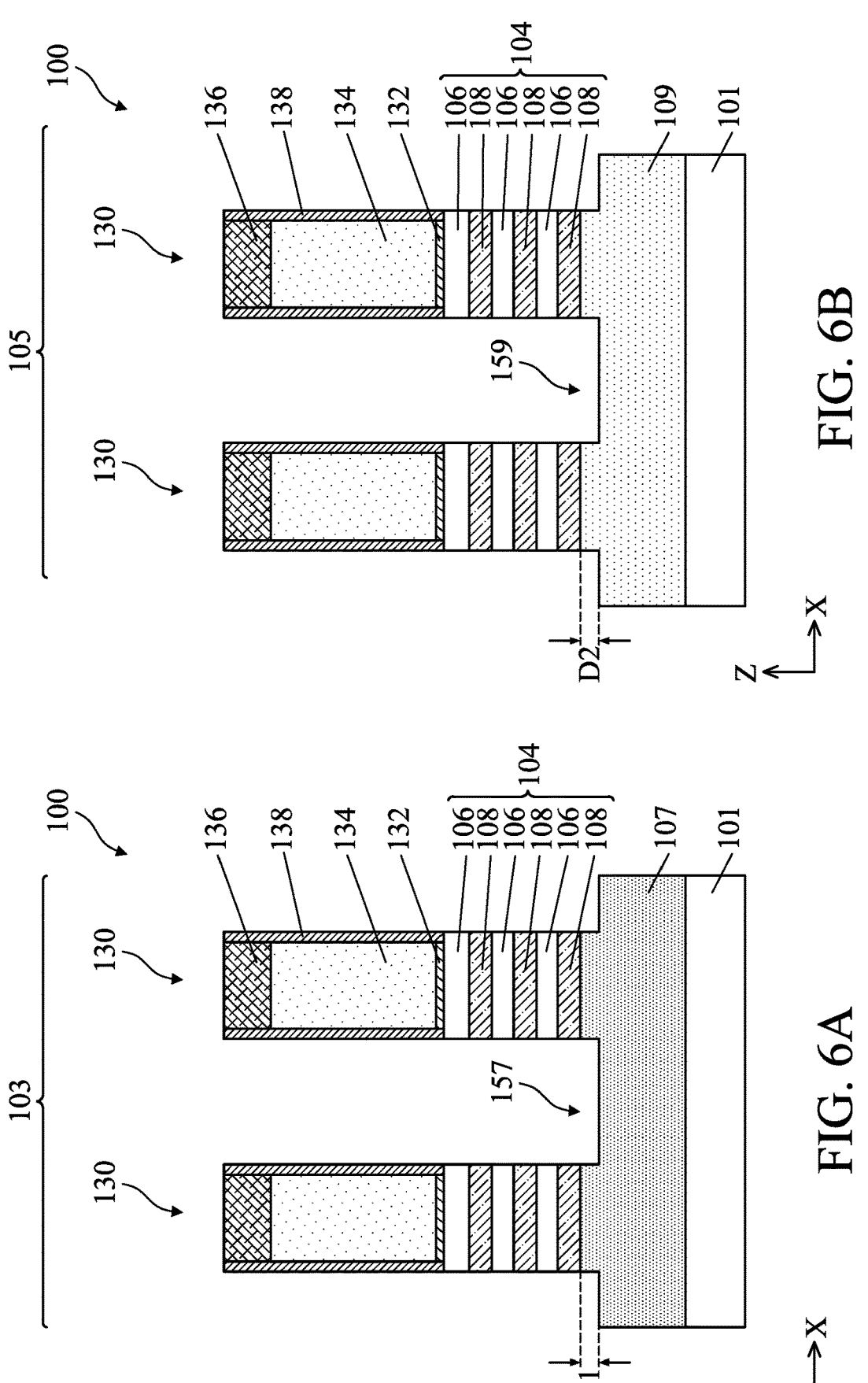
Figure 6D:
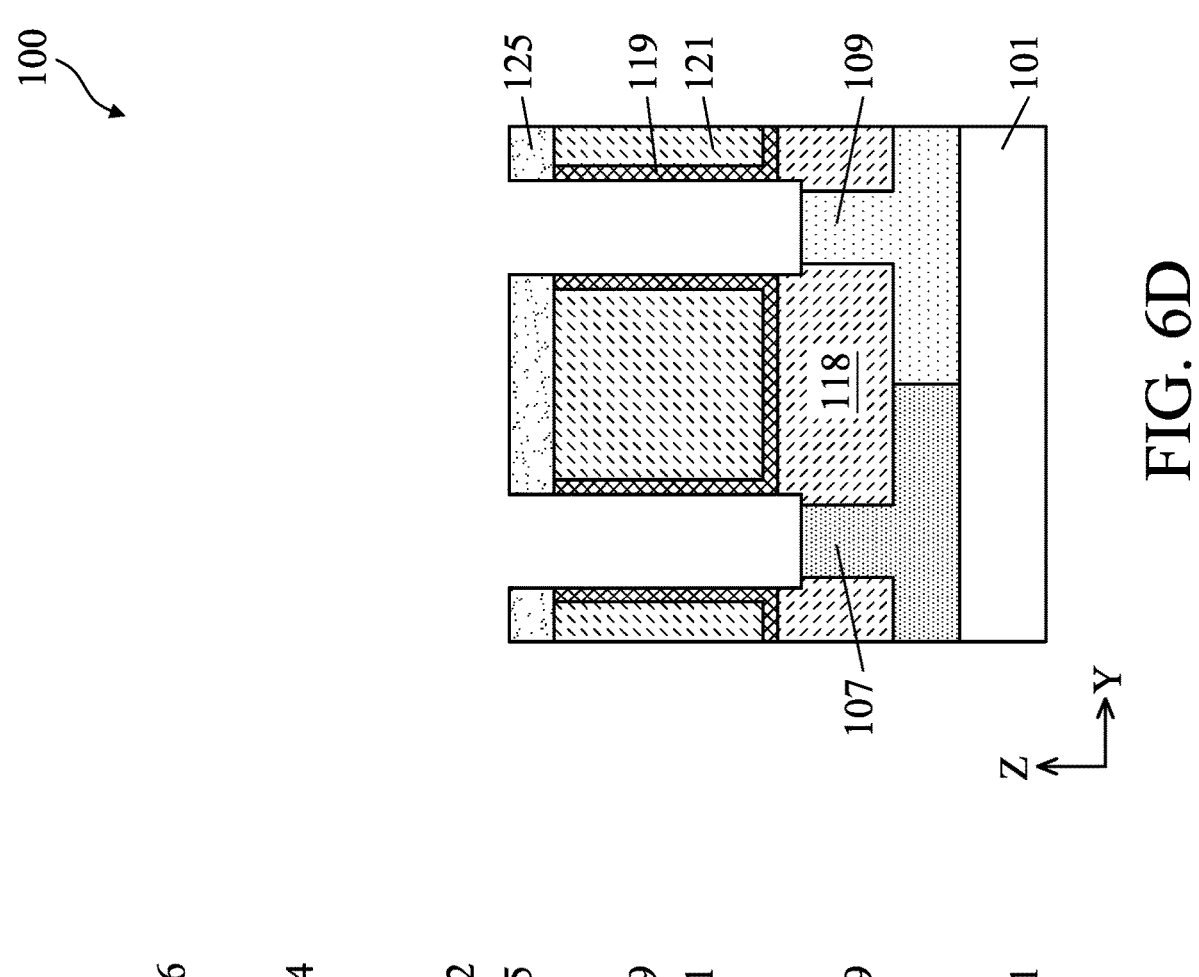
Figure 6C:
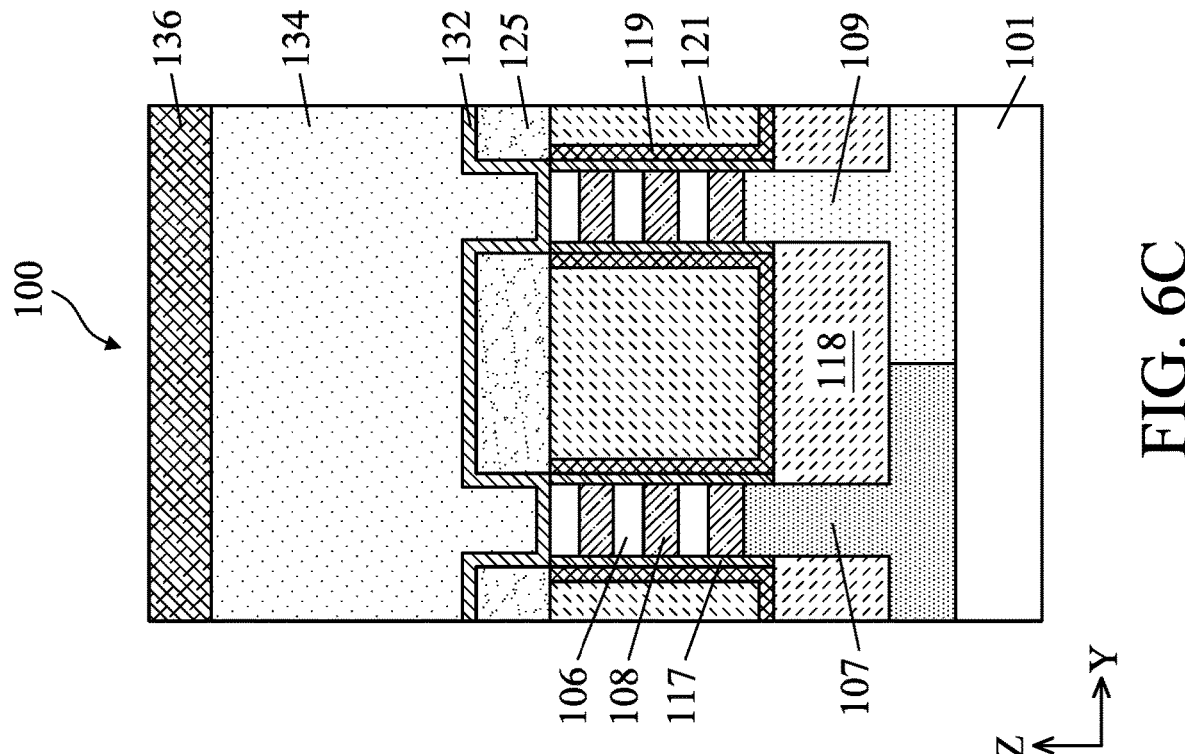

In FIG. 5, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the uppermost first semiconductor layer 106 in the stack of semiconductor layers 104. The etch process may be a selective etch process that does not substantially affect the dielectric material 125. The removal of the mask structures 110 may be performed by any suitable process, such as dry etch, wet etch, or a combination thereof.

Thereafter, one or more sacrificial gate structures 130 are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While two sacrificial gate structures 130 are shown, three or more sacrificial gate structures 130 may be arranged along the X direction in some embodiments.

FIG. 5 also illustrates that gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100 by an ALD process or any suitable conformal deposition technique. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as $SiO_2$, $Si_3N_4$, SiC, SiON, SiCN, SiOCN, carbon doped oxide, nitrogen doped oxide, porous oxide, air gaps, and/or combinations thereof.

It should be understood that the cladding layers 117 and dielectric feature 127 (i.e., hybrid fin) are optional and may not be needed. In some embodiments where the cladding layers 117 and the dielectric features 127 are not present, portions of the sacrificial gate structures 130 and the gate spacers 138 are formed on the fin structures 112 and the insulating material 118, and gaps are formed between exposed portions of the fin structures 112.

FIGS. 6A-19A are cross-sectional side views of various stages of manufacturing the semiconductor device structure 100 taken along cross-section A-A of FIG. 5, in accordance with some embodiments. FIGS. 6B-19B are cross-sectional side views of various stages of manufacturing the semiconductor device structure 100 taken along cross-section B-B of FIG. 5, in accordance with some embodiments. FIGS. 6C and 14C-19C are cross-sectional side views of various stages of manufacturing the semiconductor device structure 100 taken along cross-section C-C of FIG. 5, in accordance with some embodiments. FIGS. 6D and 14D-19D are cross-sectional side views of various stages of manufacturing the semiconductor device structure 100 taken along cross-section D-D of FIG. 5, in accordance with some embodiments. Cross-sections A-A and B-B are in a plane of the fin structure 112 (FIG. 4) along the X direction. Cross-section C-C is in a plane perpendicular to cross-section A-A and is in the sacrificial gate structure 130. Cross-section D-D is in a plane perpendicular to cross-section A-A and is in the S/D features 146 (FIGS. 14A and 14B) along the Y-direction.

In FIGS. 6A-6D, exposed portions of the fin structures 112, exposed portions of the cladding layers 117, and exposed portions of the dielectric material 125 at the first and second device regions 103, 105 not covered by the sacrificial gate structures 130 and the gate spacers 138 are selectively recessed by one or more suitable etch processes, such as dry etch, wet etch, or a combination thereof. The portions of the fin structures 112, exposed portions of the cladding layers 117, exposed portions of the dielectric material 125, and a portion of the wells 107, 109 are removed to expose the sidewalls of the fin structures 112 (FIG. 4). In some embodiments, the exposed portions of the fin structures 112 are recessed to a level at or slightly below a bottom surface of the second semiconductor layer 108 in contact with the wells 107, 109 of the substrate 101, respectively. Therefore, the sidewall of the bottommost second semiconductor layer 108 of each fin structure 112 is fully exposed. In some embodiments, the removal process includes two etch processes, in which a first etch process is performed to remove the exposed portions of the stacks of semiconductor layers 104 of the fin structures 112, the cladding layers 117, and the dielectric material 125, and expose portions of the wells 107, 109, and a second etch process is performed to remove the exposed portions of the wells 107, 109. The removal of the portions of the wells 107, 109 results in recesses 157, 159 formed in the top portion of the bulk silicon region (e.g., wells 107, 109), while the top portion of the bulk silicon region under the sacrificial gate structure 130 is covered and not removed. As a result of the removal of the portions of the wells 107, 109, a top surface of the exposed wells 107, 109 is at a level lower than an interface defined between the bottommost second semiconductor layer 108 and the wells 107, 109 by a distance D1, D2, respectively. In some embodiments, the distance D1 and D2 is in a range from about 5 nm to about 30 nm.

In some embodiments, the removal process is performed such that the exposed wells 109 (e.g., n-type wells) at the second device region 105 are etched deeper than the exposed wells 107 (e.g., p-type wells). As channel mobility of PMOS devices (e.g., p-type gate all around transistors) is closely correlated to the dimension of source/drain (S/D) features, having the greater amount of the exposed wells 109 removed can result in the subsequent S/D features 147 (FIG. 14B) formed with greater volume, and therefore higher strain effects for PMOS devices ion improvement. In such a case, the distance D2 may be greater than the distance D1 by, for example, about 3 nm to about 15 nm.

Figures 7A, 7B:
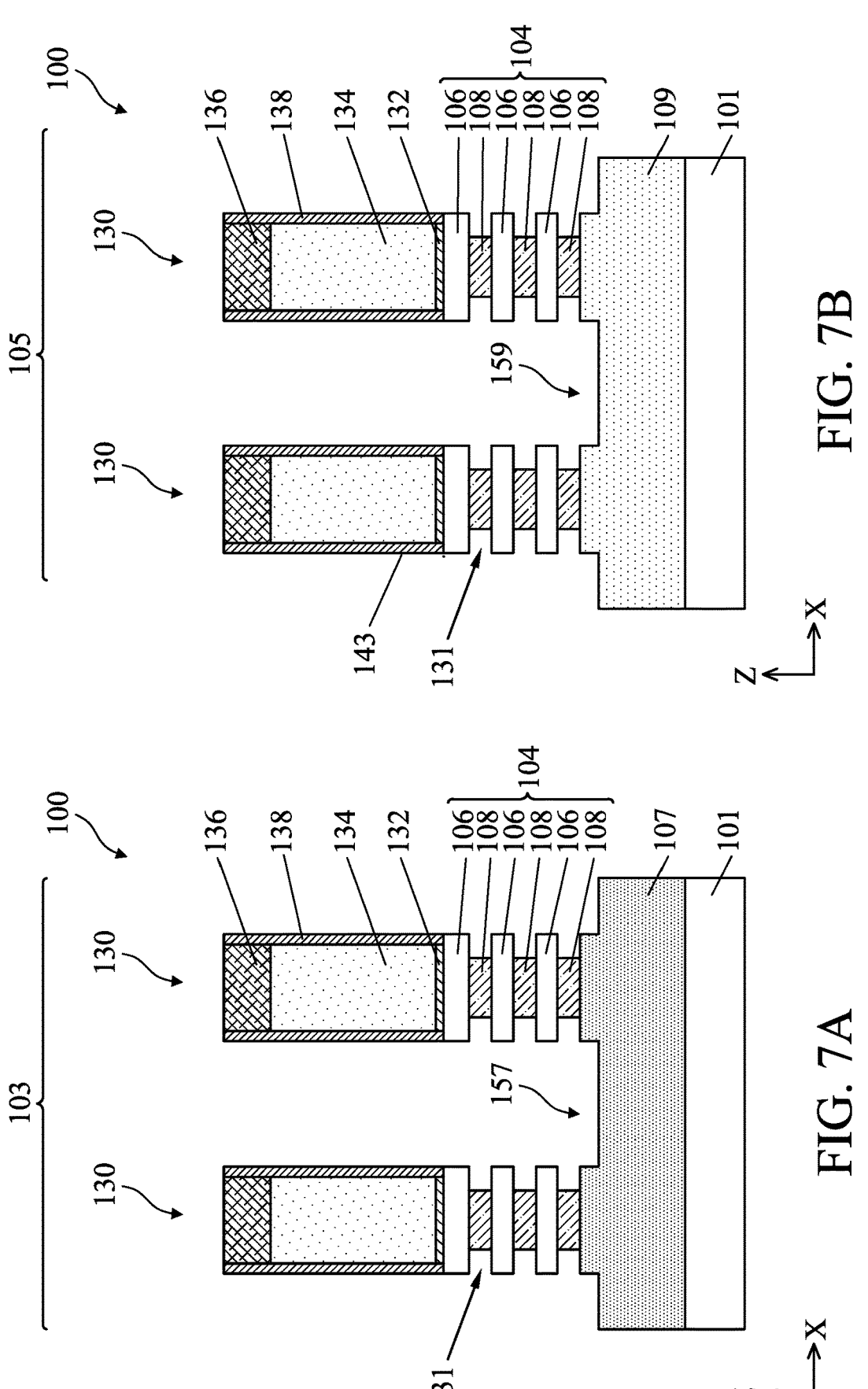

In FIGS. 7A and 7B, edge portions of each second semiconductor layer 108 of the stack of semiconductor layers 104 are removed horizontally along the X direction. The removal of the edge portions of the second semiconductor layers 108 forms cavities 131. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. During the recess etching of the second semiconductor layers 108, portions of the first semiconductor layers 106 may also be horizontally etched. The recessed amount of the second semiconductor layers 108 is greater than the recessed amount of the first semiconductor layers 106.

Figures 8A, 8B:
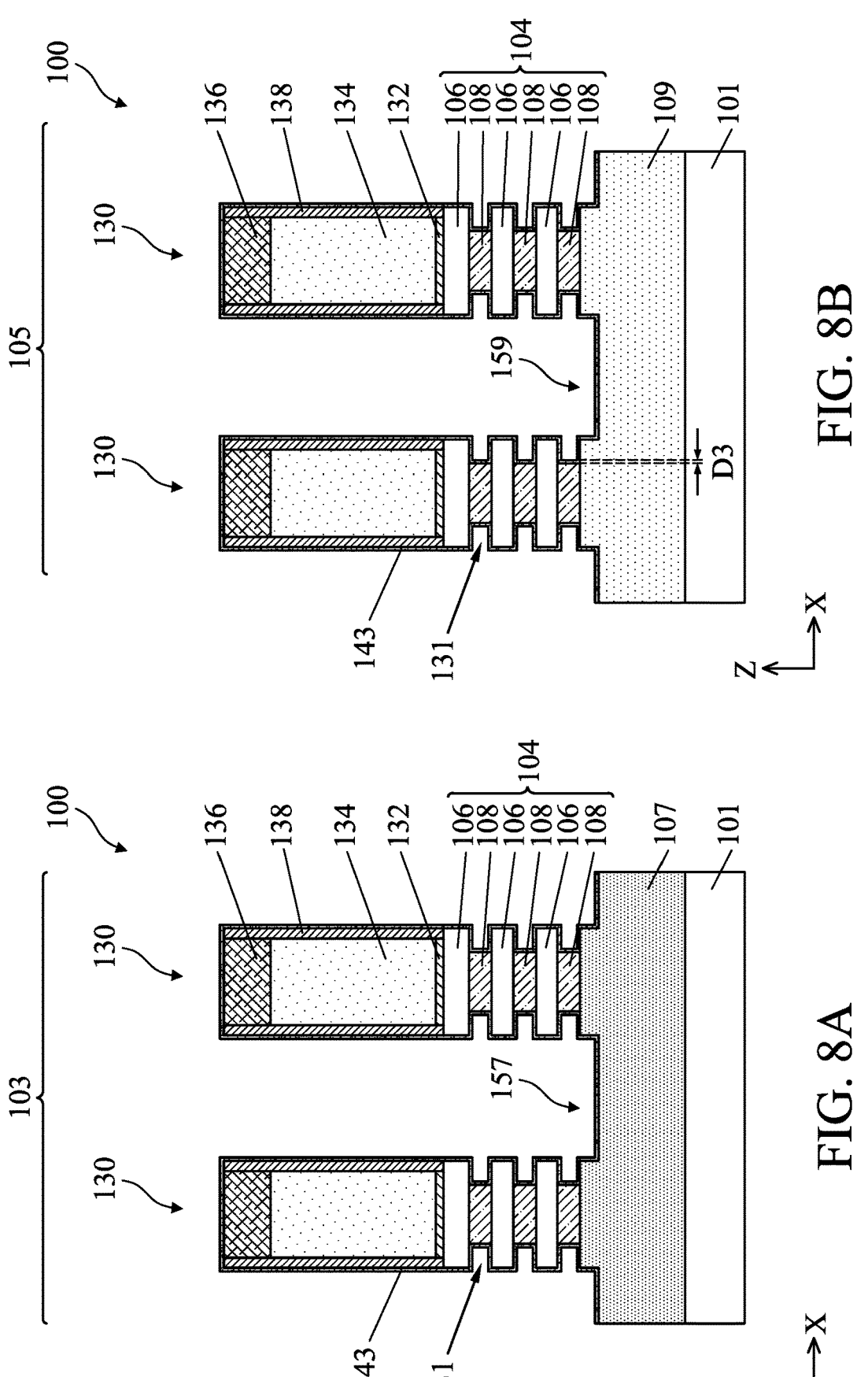
Figures 10A, 10B:
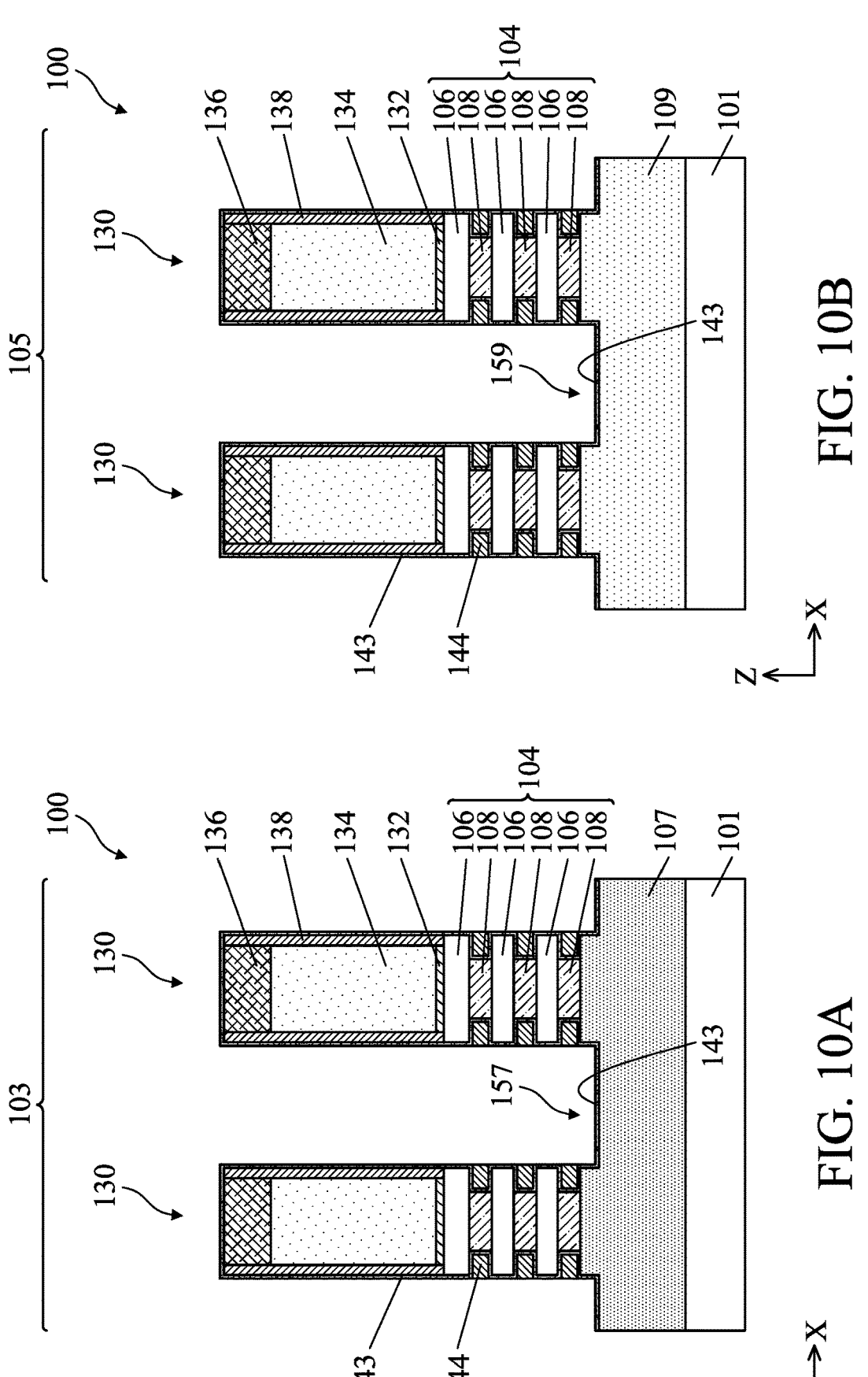
Figures 14A, 14B:
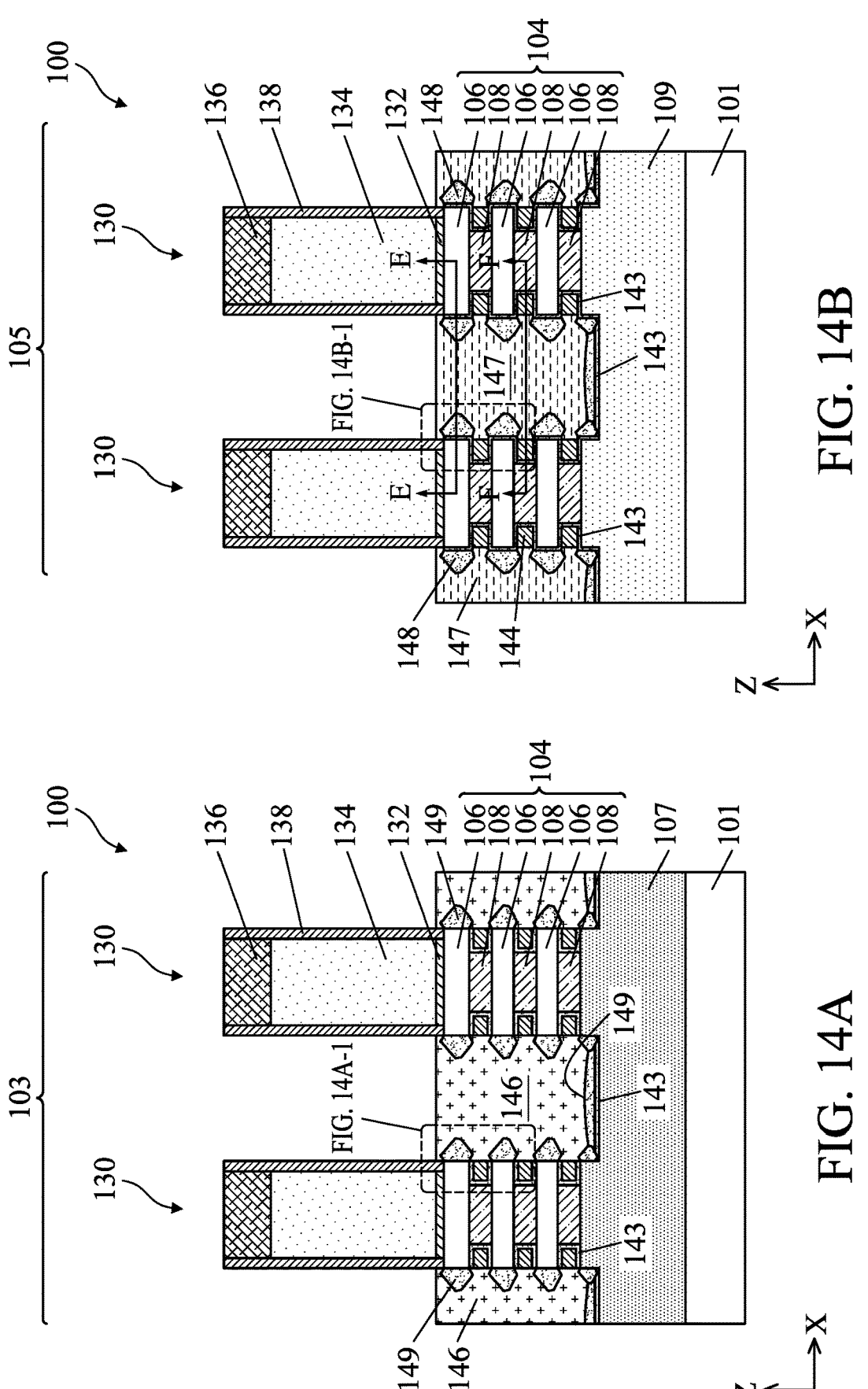
Figures 14C, 14D:
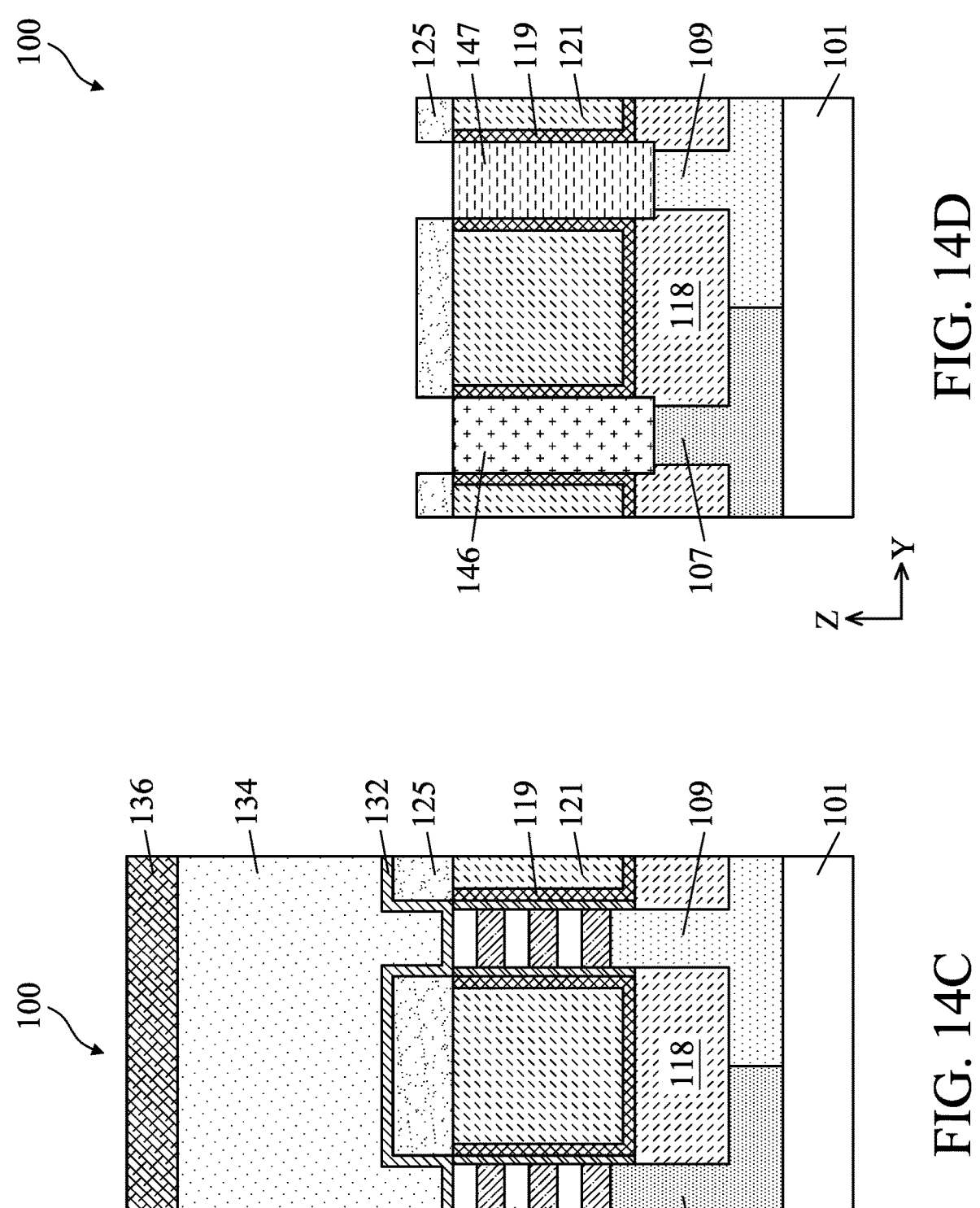
Figures 1, 14A, 14B:
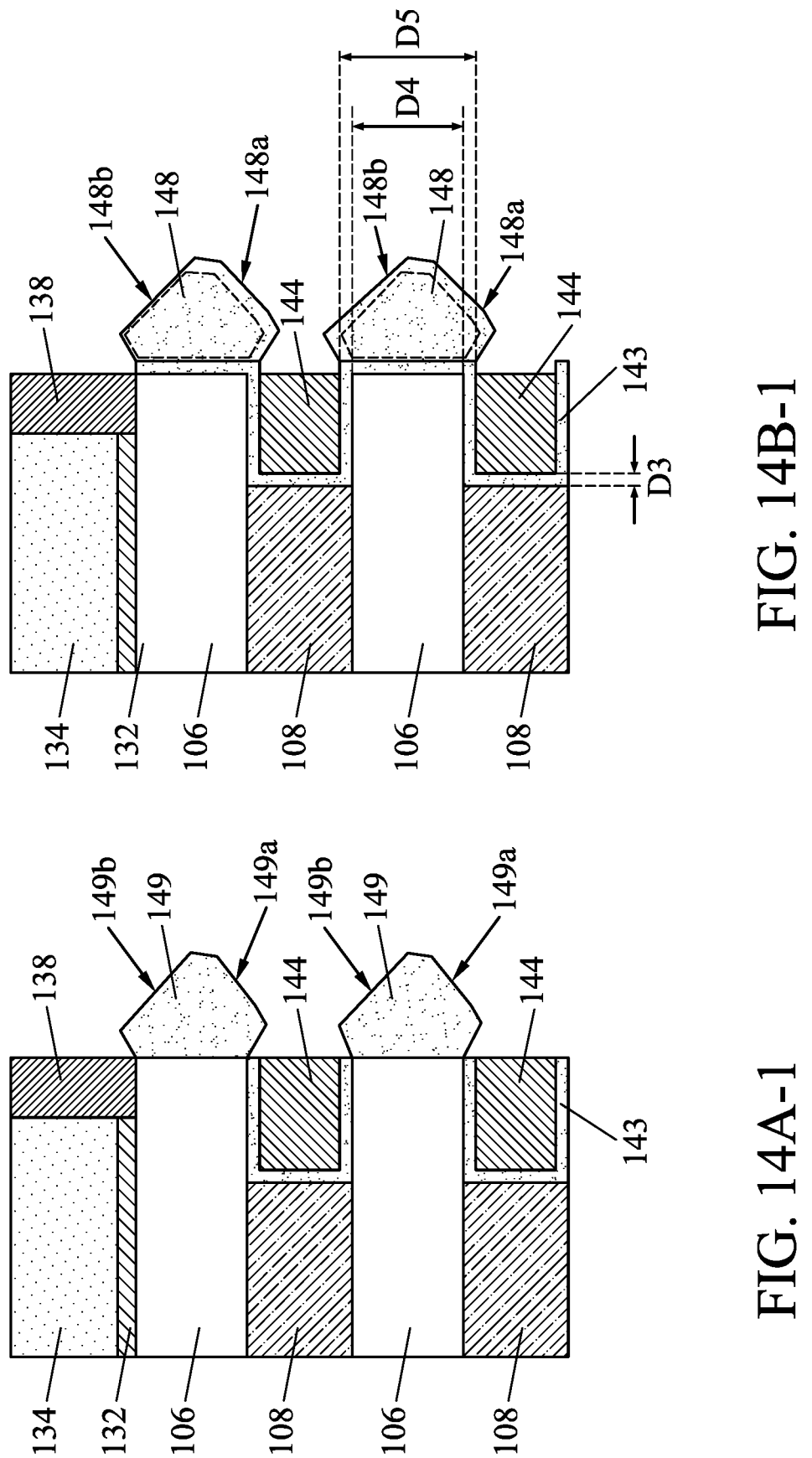
Figures 15A, 15B:
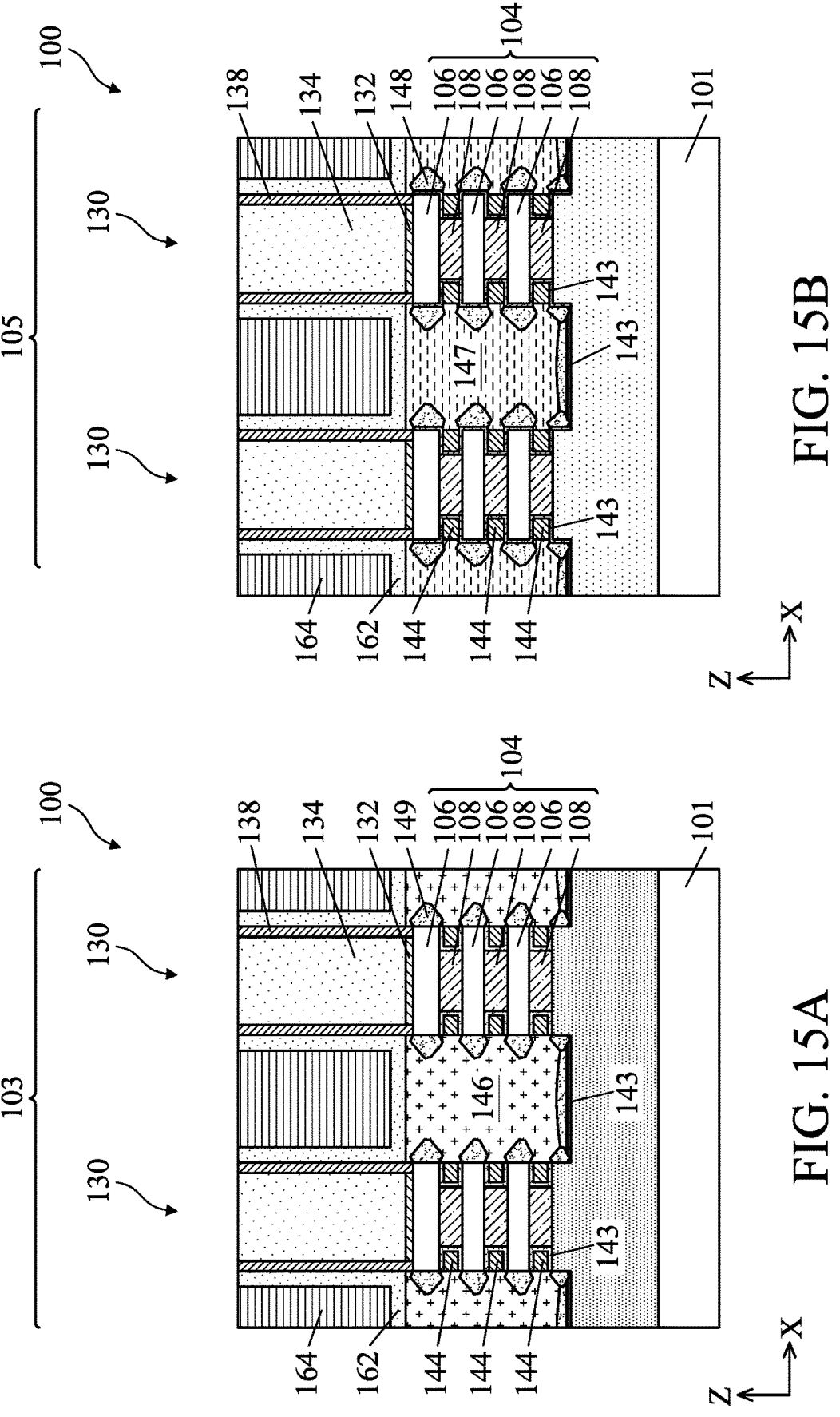
Figure 15D:
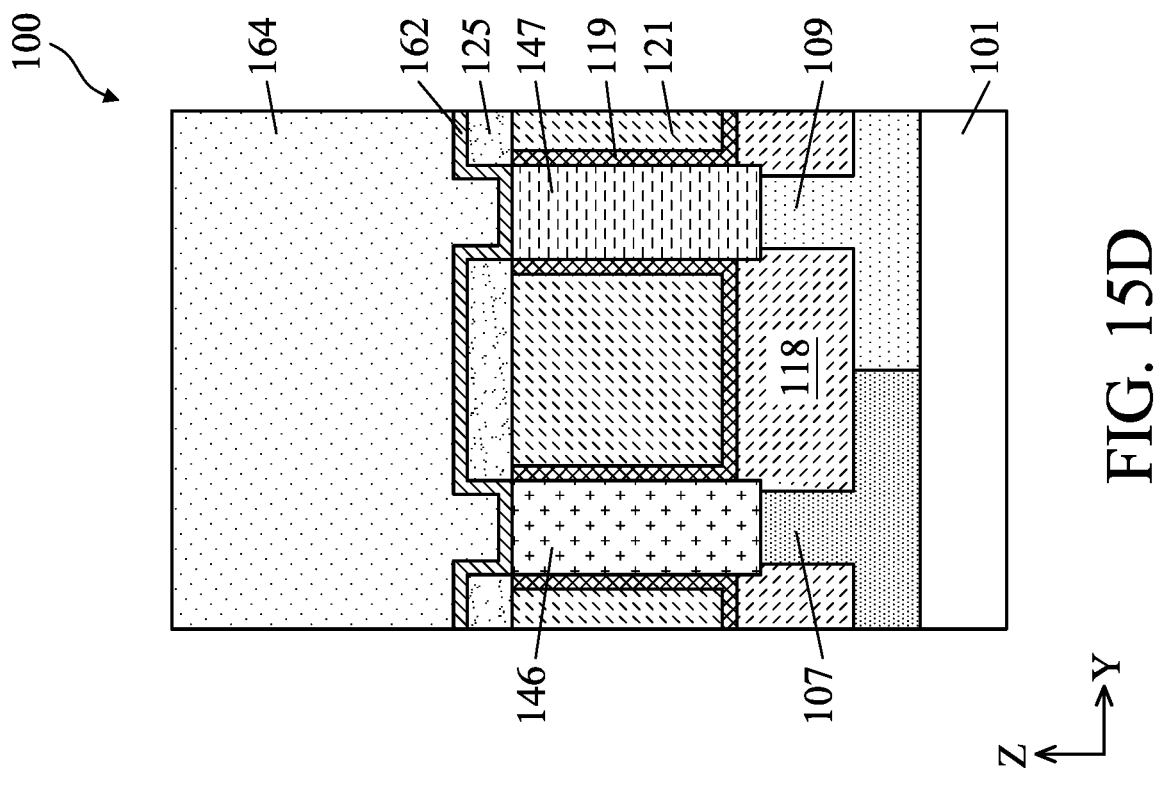
Figure 15C:
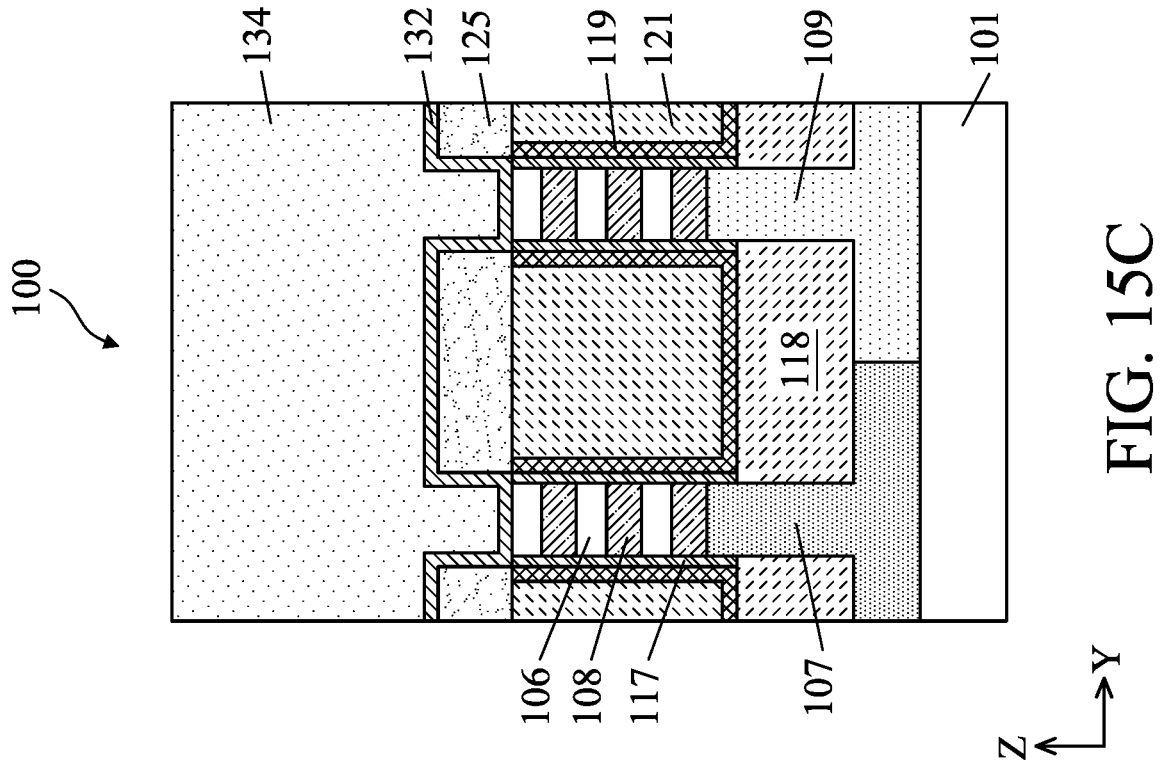
Figure 16B:
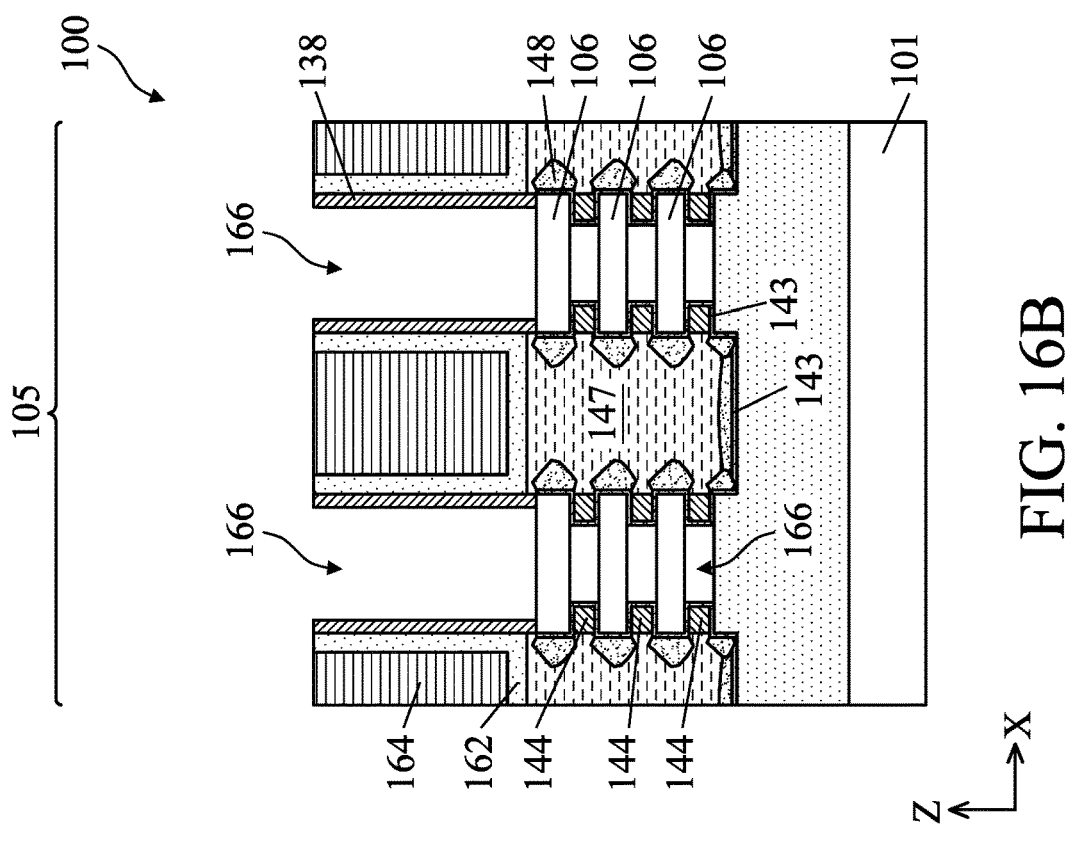
Figure 16A:
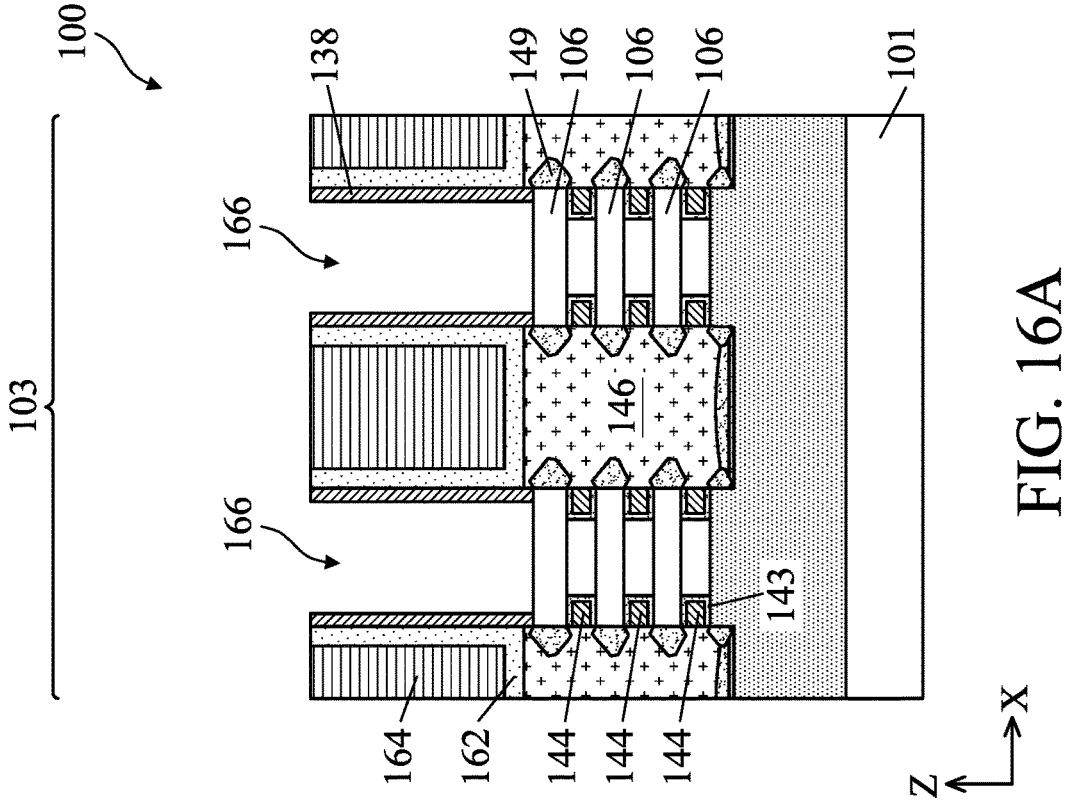
Figure 16D:
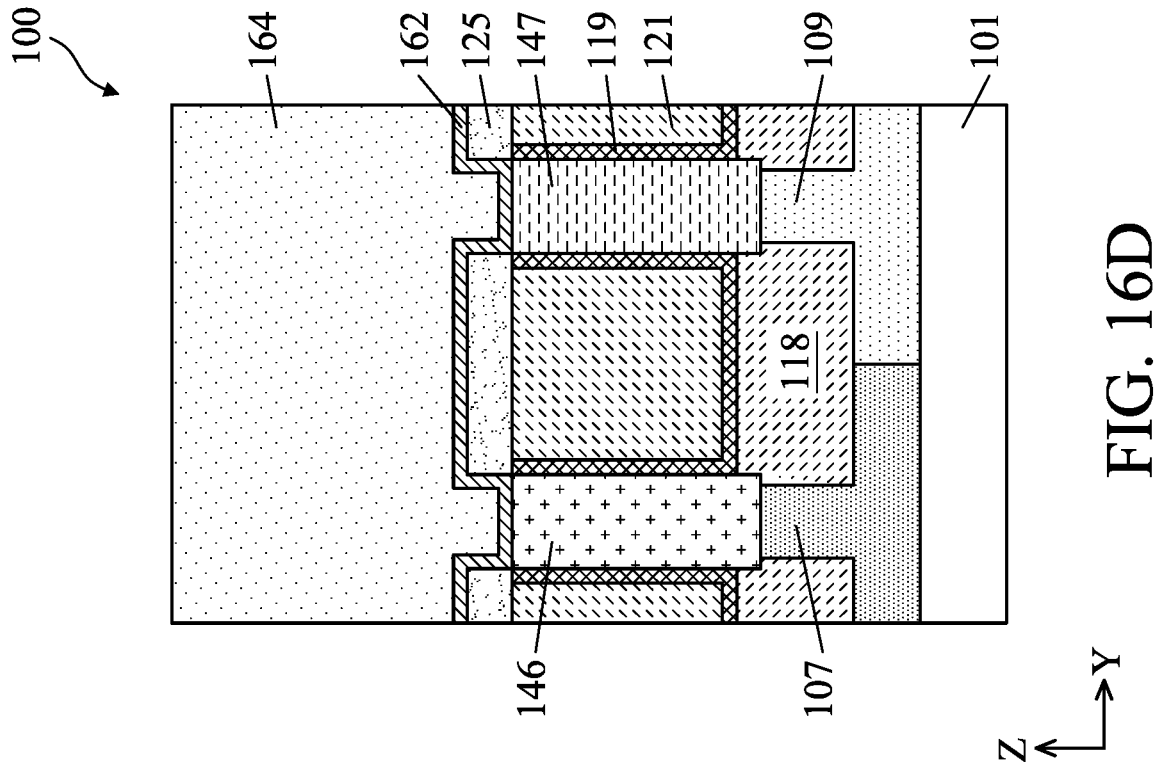
Figure 16C:
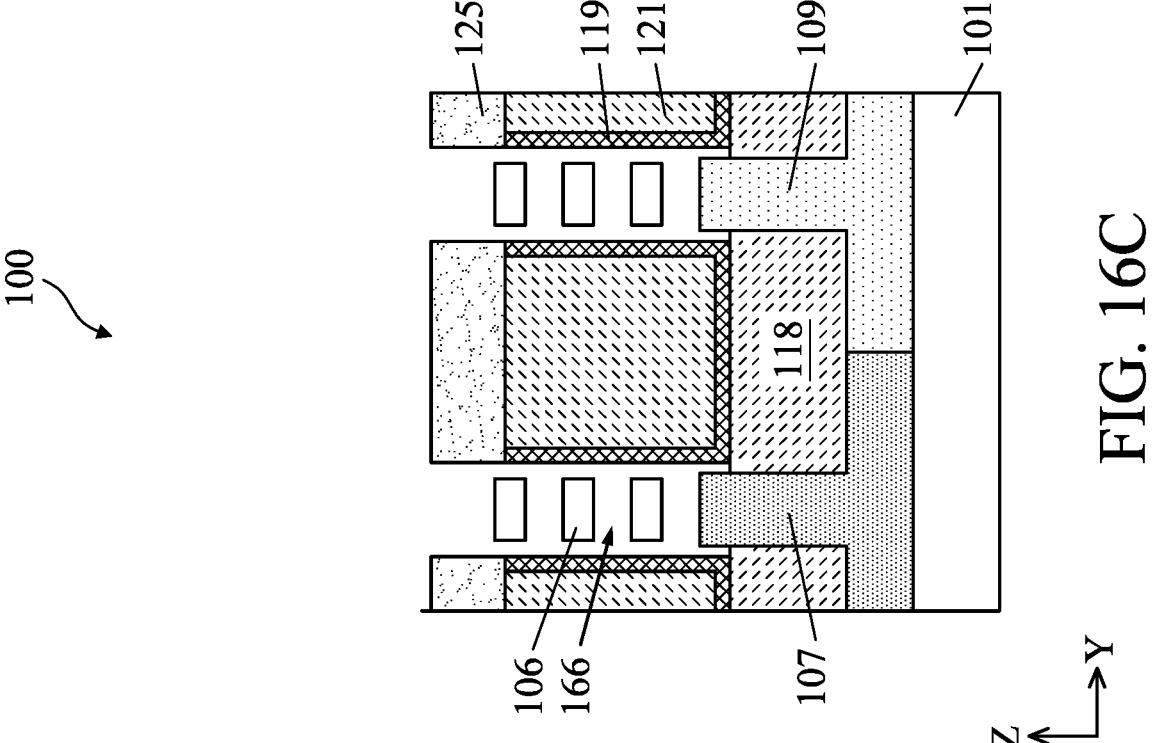

In FIGS. 8A and 8B, a cap layer 143 is conformally formed on the exposed surfaces of the sacrificial gate structures 130, the first semiconductor layers 106, and the second semiconductor layers 108. In some embodiments, the cap layer 143 is further formed on the exposed portions of the wells 107, 109 of the substrate 101. The cap layer 143 serves as an etch stop layer to prevent etchant chemicals (used during subsequent removal of the second semiconductor layers 108) from breaking through subsequently formed inner spacers 144 (FIGS. 10A and 10B). If the inner spacers 144 are broken, the etch process to remove the second semiconductor layers 108 may also remove subsequently formed S/D features 147 (FIG. 14B). This is because the atomic percentage of germanium of the second semiconductor layers 108 is similar to or lower than that of the material of the S/D features 147 (e.g., SiGe:B) at the second device region 105. As a result, the S/D features 147 may be damaged or even be removed entirely by the etch process. In any case, the formation of the cap layer 143 between the second semiconductor layers 108 and the subsequent inner spacers 144 avoids or minimizes the damage to the inner spacers 144 during removal of the second semiconductor layers 108, thereby protecting the integrality of the S/D features 146, 147. The combined thickness (e.g., about 2-8 nm) of the cap layer 143 and the inner spacers 144 can avoid reliability issues, such as time dependent dielectric breakdown (TDDB).

The cap layer 143 may be formed by any suitable material that can withstand a chemical attack during subsequent removal of the second semiconductor layers 108. In some embodiments, the cap layer 143 is made of a dielectric material that is different from the material of the gate spacers 138. Suitable materials for the cap layer 143 may include, but are not limited to, SiO, SiN, SiC, SiCN, SiON, SiOCN, AlO, AlN, AlON, AlSiO, ZrO, ZrN, ZrAlO, $HfO_2$, HfSiO, HfSiON, HfAlO, HfLaO, HfZrO, HfTaO, HfSiO, LaO, TiO, $Ta_2O_5$, $Y_2O_3$, or any suitable oxide-based dielectrics, nitride-based dielectrics, carbon-based dielectrics, or high-k materials (e.g., a material having a k value≥7), or any combination thereof.

The use of high-k materials for the cap layer 143 may be advantageous since they not only prevent wire release (removal of the second semiconductor layers 108) induced damages to the inner spacers 144 but also reduce parasitic effective capacitance (Ceff), which is related to delays of gates and resistive-capacitive (RC) time constant. In some embodiments, the cap layer 143 is formed of pure silicon (e.g., intrinsic or undoped) or substantially pure silicon (e.g., substantially free from impurities, for example, with a percentage of impurity lower than about 1 percent). In some embodiments, the cap layer 143 is formed of a doped silicon. In cases where the cap layer 143 is a doped silicon, the dopant of a group III element, such as boron, may be used. In one exemplary embodiment, the cap layer 143 is a boron-doped silicon (Si:B). In various embodiments, the dopant concentration of the cap layer 143 may be in a range from about $1E10^{17}$ cm$^{-3}$ to about 5E20 cm$^{-3}$, such as about 3E21 cm$^{-3}$. It has been observed that the cap layer 143 formed of a boron-doped silicon can effectively retard etch chemicals used to remove the second semiconductor layers 108 during the formation of nanostructure channels in a multi-gate device. As a result, the integrality of the inner spacers 144 is protected. The use of Si:B as the cap layer 143 may be advantageous in some embodiments because the boron dopants may alter crystal orientation of the underlying materials (e.g., first semiconductor layers 106 and the wells 107, 109 of the substrate 101) to promote facet formation of the subsequent facetted structures 148 (FIG. 14B) and therefore, the growth of the subsequent epitaxial S/D features 147 (FIG. 14B) on the facetted structures 148.

In some embodiments, the cap layer 143 is a single layer structure. In some embodiments, the cap layer 143 is a multi-layer structure. In any case, the cap layer 143 may have a thickness D3 of about 0.1 nm to about 2 nm, for example about 0.5 nm to about 1.5 nm. The cap layer 143 may be formed by a conformal deposition process, such as ALD. The precursors may be chosen to make the conformal deposition process a selective or non-selective deposition process. In some embodiments, the conformal deposition process is a non-selective process, meaning the cap layer 143 is globally formed on the exposed surfaces of the sacrificial gate structures 130 (e.g., mask layer 136 and gate spacers 138), the first semiconductor layers 106, and the second semiconductor layers 108, as shown in FIGS. 8A and 8B. In some embodiments, the conformal deposition process is a selective process, meaning the cap layer 143 is selectively formed on the semiconductor materials (e.g., first and second semiconductor layers 106, 108) but not on the dielectric materials (e.g., mask layer 136 and gate spacers 138), as the alternative embodiment shown below in FIGS. 12A and 12B.

Figures 9A, 9B:
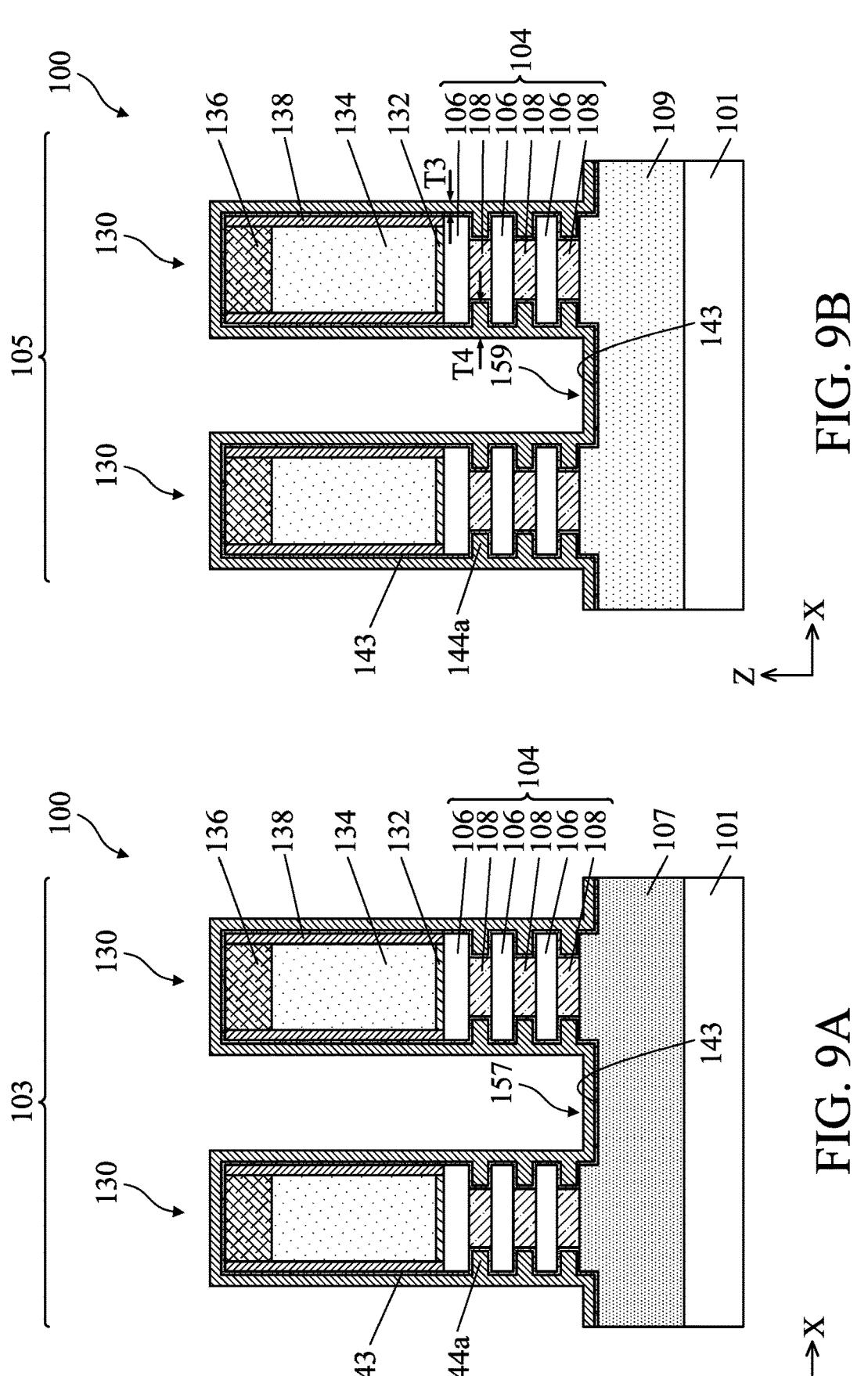

In FIGS. 9A and 9B, a dielectric layer 144a is deposited on the cap layer 143. The dielectric layer 144a also fills the cavities 131 provided by the removal of the edge portions of the second semiconductor layers 108 as discussed above with respect to FIGS. 7A and 7B. The dielectric layer 144a may be made of a dielectric material that is different from the material of the cap layer 143. Suitable materials for the dielectric layer 144a may include, but are not limited to, $SiO_2$, $Si_3N_4$, SiC, SiCP, SiON, SiOC, SiCN, SiOCN, and/or other suitable material. Other materials, such as low-k materials with a k value less than about 3.5, may also be used. The formation of the dielectric layer 144a may be formed by a conformal deposition process, such as ALD.

The thickness T3 of the dielectric layer 144a adjacent the first semiconductor layers 106 (and wells 107, 109 of the substrate 101) may be in a range of about 1 nm to about 4 nm, while the thickness T4 of the dielectric layer 144a adjacent the second semiconductor layers 108 may be in a range of about 2 nm to about 10 nm. In some embodiments, the dielectric layer 144a is a single layer structure. In some embodiments, the dielectric layer 144 is a multi-layer structure.

In FIGS. 10A and 10B, portions of the dielectric layer 144a are removed and the portions of the dielectric layer 144a remain in the cavities 131 (FIGS. 7A and 7B) between the adjacent first semiconductor layers 106 to form inner spacers 144. In some embodiments, the dielectric layer 144a formed adjacent the sacrificial gate structures 130, the first semiconductor layers 106, and the wells 107, 109 of the substrate 101 are removed. The removal process may be any suitable etch processes, such as dry etch, wet etch, or a combination thereof. The etch process may use an etchant that selectively removes the dielectric layer 144a without substantially removing the cap layer 143. The removal of the portions of the dielectric layer 144a may be performed by an anisotropic etching. The dielectric layer 144a within the cavities 131 are protected by the first semiconductor layers 106 and the cap layer 143 during the anisotropic etching process. The remaining second semiconductor layers 108 are capped between the inner spacers 144 along the X direction.

Figures 11A, 11B:
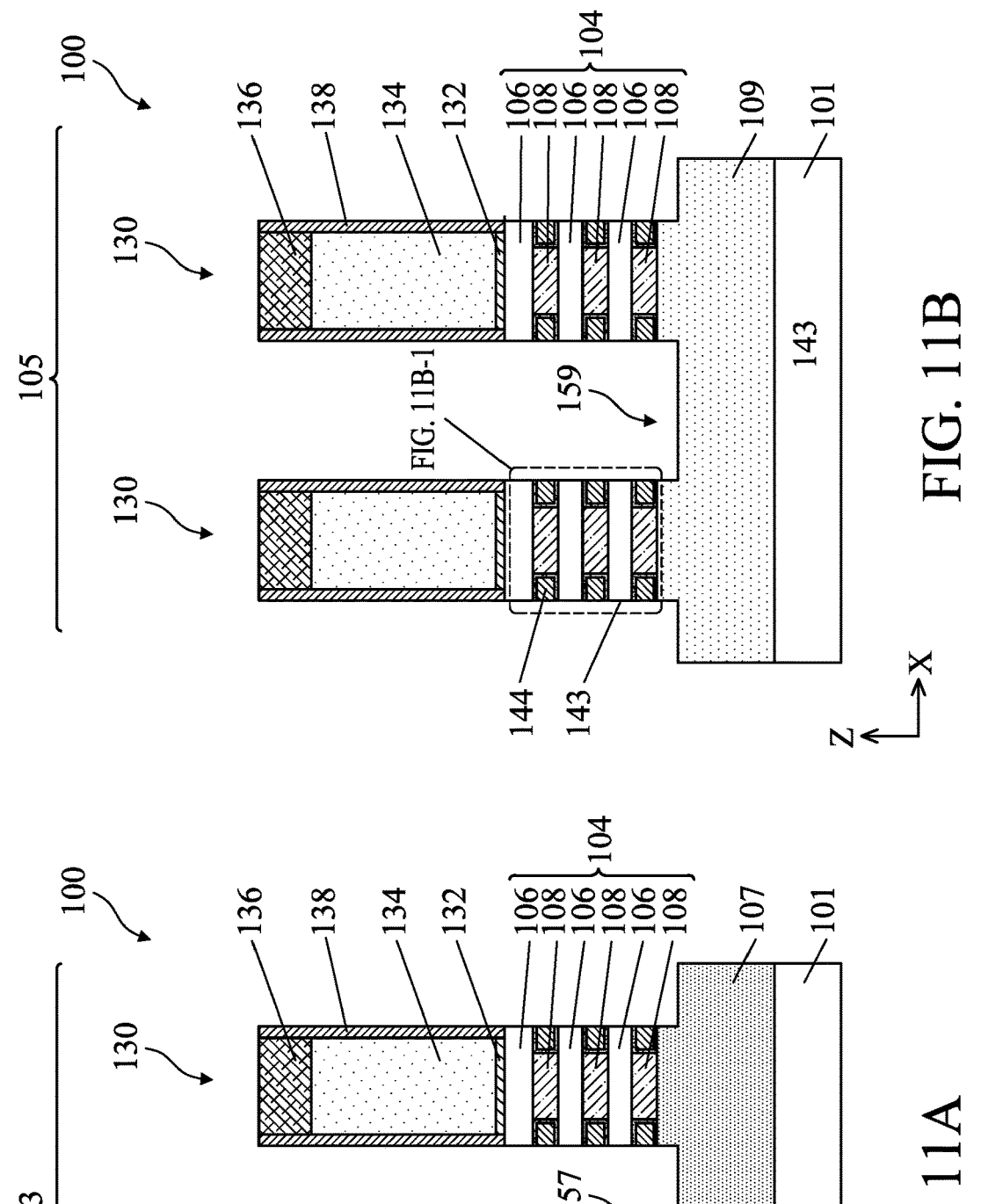
Figures 1, 11B:
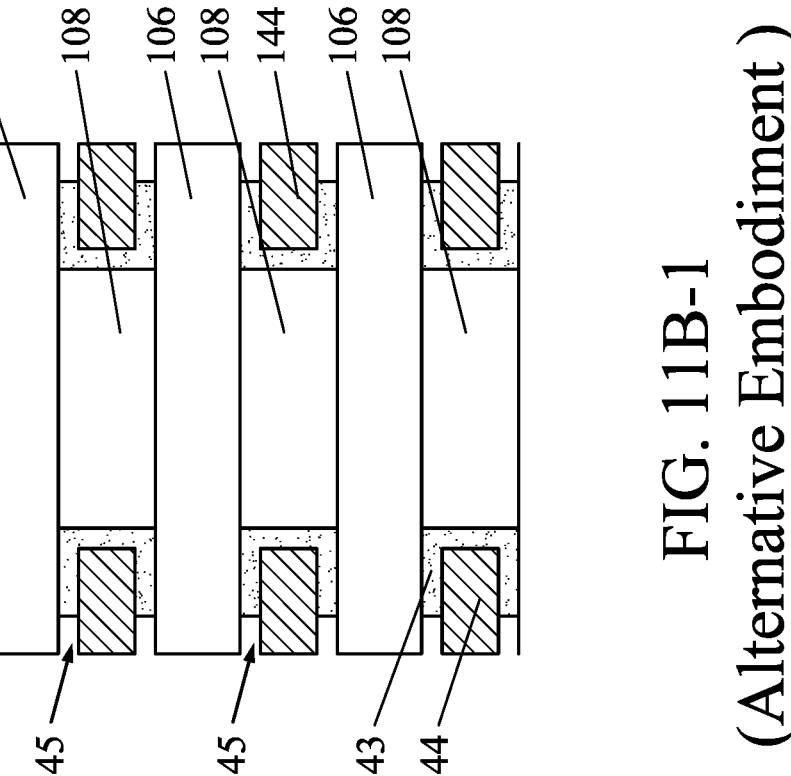

In FIGS. 11A and 11B, after the removal of portions of the dielectric layer 144a, exposed portions of the cap layer 143 are removed. The cap layer 143 on the exposed surfaces of the sacrificial gate structures 130, the first semiconductor layers 106, and the wells 107, 109 of the substrate 101 may be removed by a removal process. The removal process may be a selective etch process that is configured to etch the cap layer 143 but not the inner spacers 144. The duration of the selective etch process may be controlled so that the cap layer 143 disposed between and in contact with the inner spacers 144 and the first semiconductor layers 106 and the second semiconductor layers 108 still remains upon completion of the selective etch process.

Additionally or alternatively, the duration of the selective etch process may be controlled so that not only the cap layer 143 on first surfaces (i.e., vertical surfaces along the Z direction) of the first semiconductor layers 106 is removed, but a portion of the cap layer 143 on the second surfaces (i.e., horizontal surfaces along the X direction) of the first semiconductor layers 106 is also removed. In such cases, a gap is formed between the inner spacers 144 and the first semiconductor layers 106. FIG. 11B-1 illustrates an enlarged view of a portion of the semiconductor device structure 100 of FIG. 11B in accordance with some alternative embodiments. In this embodiment, a gap 145 is formed between the inner spacers 144 and the first semiconductor layers 106 as a result of the selective etch process discussed above. The removal of a portion of the cap layer 143 between the inner spacers 144 and the first semiconductor layers 106 results in a substantial C-shape or U-shape structure of the cap layer 143 sandwiched between the adjacent first semiconductor layers 106 and in contact with the first semiconductor layers 106, the second semiconductor layers 108, and the inner spacers 144. The gap 145 may later be filled with the S/D features 146, 147 or facetted structures 148, 149 (FIGS. 14A, 14B).

Figures 12A, 12B:
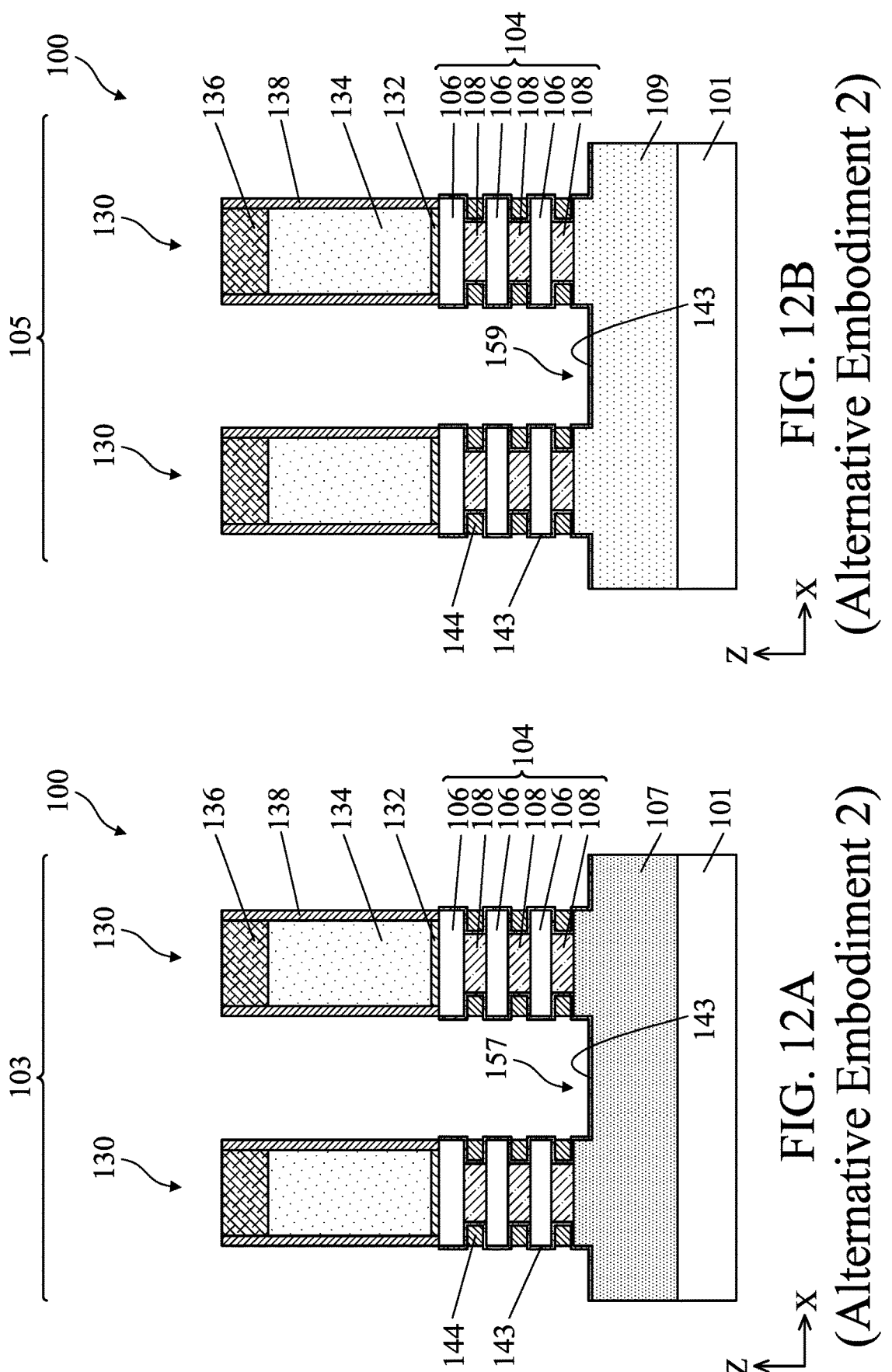

FIGS. 12A and 12B illustrate another alternative embodiment in which the cap layer 143 is in contact with the first and second semiconductor layers 106, 108. In this embodiment, after edge portions of each second semiconductor layer 108 of the stack of semiconductor layers 104 are removed horizontally, the cap layer 143 is selectively formed on the semiconductor surfaces (e.g., exposed surfaces of the first and second semiconductor layers 106, 108 as well as the wells 107, 109 of the substrate 101) but not on the dielectric surfaces (e.g., exposed surfaces of the mask layer 136 and the gate spacers 138 of the sacrificial gate structures 130). The dielectric layer 144a is then formed on the exposed surfaces of the sacrificial gate structures 130 and the cap layer 143 and partially removed in a similar fashion as those discussed above with respect to FIGS. 9A-9B and 10A-10B. The removal of the exposed cap layer 143 described in FIGS. 11A and 11B are omitted. The inner spacers 144 are thus formed within the cavities 131 (FIGS. 7A and 7B) between the adjacent first semiconductor layers 106. The resulting inner spacers 144 are in contact with the cap layer 143.

Figures 13A, 13B:
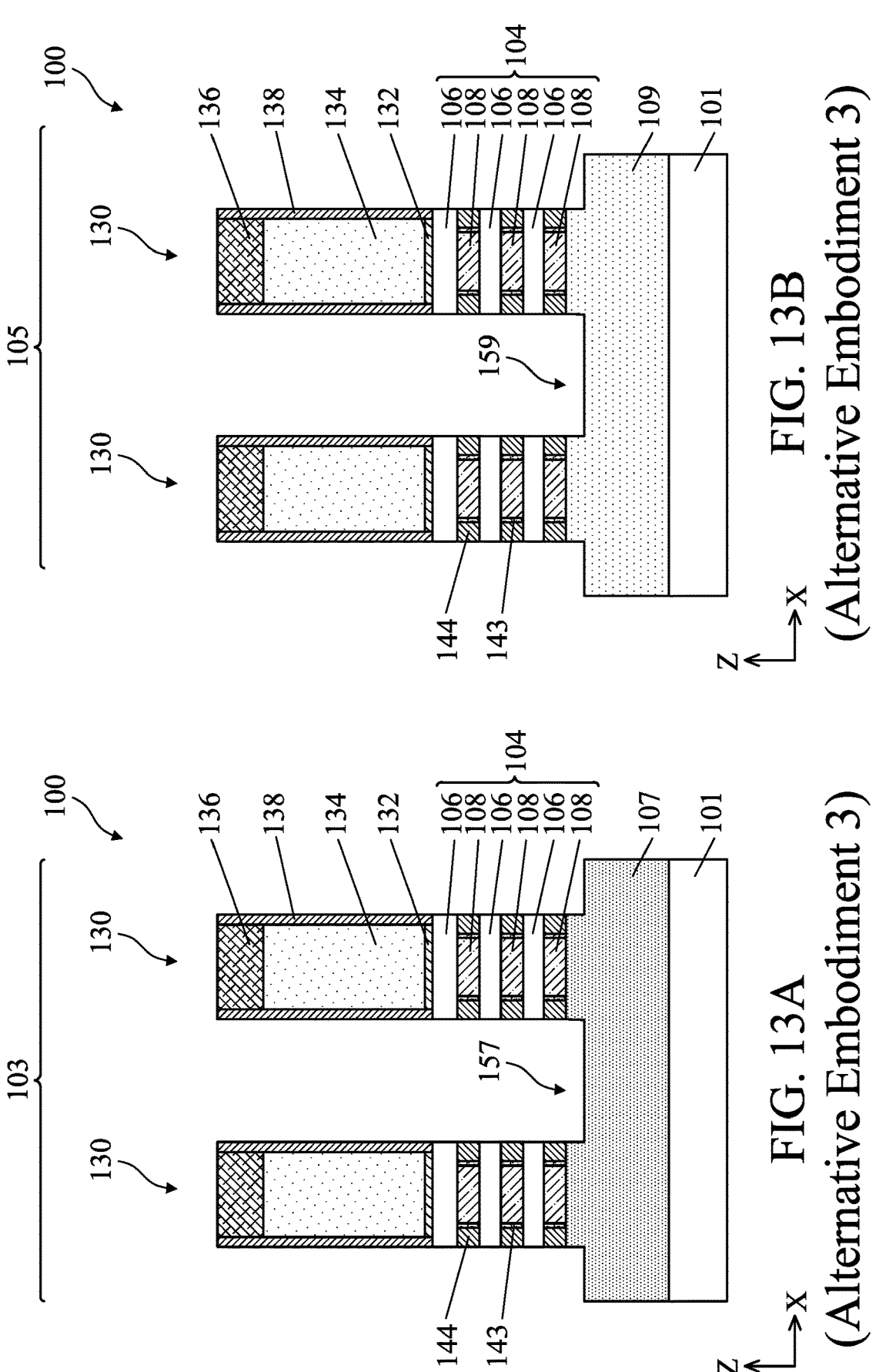

FIGS. 13A and 13B illustrate yet another alternative embodiment in which the cap layer 143 is disposed only between the inner spacers 144 and the second semiconductor layers 108. In such cases, after edge portions of each second semiconductor layer 108 of the stack of semiconductor layers 104 are removed horizontally, the cap layer 143 may be selectively formed on the exposed surfaces of the second semiconductor layers 108, but not on the first semiconductor layers 106 and the sacrificial gate structures 130. Thereafter, the dielectric layer 144a is formed on the exposed surfaces of the sacrificial gate structures 130, the first semiconductor layers 106, and the cap layer 143. Portions of the dielectric layer 144a is then removed in a similar fashion as discussed above with respect to FIGS. 11A and 11B to form the inner spacers 144. In this embodiment, a first surface (e.g., horizontal surfaces along the X direction) of the inner spacer 144 is in contact with the first semiconductor layers 106, while a second surface (i.e., vertical surfaces along the Z direction) of the inner spacer 144 is in contact with the cap layer 143. Therefore, the cap layer 143 is disposed between and in contact with the inner spacer 144 and the second semiconductor layer 108.

In FIGS. 14A-14D, after formation of the inner spacers 144, S/D features 146 are formed in the S/D regions between the neighboring sacrificial gate structures 130 at the first device region 103, and S/D features 147 are formed in the S/D regions between the neighboring sacrificial gate structures 130 at the second device region 105. The S/D features 146, 147 may be the S/D regions. For example, one of a pair of S/D features 146, 147 located on one side of the sacrificial gate structures 130 may be a source region, and the other of the pair of S/D features 146, 147 located on the other side of the sacrificial gate structures 130 may be a drain region. A pair of S/D features 146, 147 includes a source feature 146, 147 and a drain feature 146, 147 connected by the nanostructure channels (i.e., the first semiconductor layers 106). Therefore, a source and a drain are interchangeably used in this disclosure.

In one exemplary embodiment of FIGS. 14A-14D, the cap layer 143 is a boron-doped silicon and is formed in accordance with the embodiment shown in FIGS. 12A and 12B. The boron concentration of the cap layer 143 may be in a range from about zero (e.g., pure silicon) to about 3E21 cm$^{-3}$. Since the p-type dopants (e.g., boron) generally do not favor electrical properties of the NMOS devices, in cases where the cap layer 143 contains boron, an etch process may be performed prior to formation of the S/D features 146 to remove the cap layer 143 from the first surfaces (i.e., vertical surfaces along the Z direction) of the first semiconductor layers 106 at the first device region 103. The etch process may be any suitable process, such as dry etch, wet etch, or a combination thereof. In some embodiments, the etch process includes a dry etch process, followed by a wet clean process. The removal of the cap layer 143 at the first device region 103 allows the S/D features 146 to be grown from the first semiconductor layers 106, instead of the cap layer 143 that contains boron. On the other hand, the S/D features 147 at the second device region 105 is grown from the cap layer 143 that is formed on the first surfaces of the first semiconductor layers 106. The S/D features 160 may grow both vertically and horizontally to form facets, which may correspond to crystalline planes of the material of the first semiconductor layers 106 and/or the cap layers 143.

The S/D features 146 may be formed by initially protecting the second device region 105 with a photoresist or other masking materials. Once the second device region 105 has been protected, an optional etch process is performed at the first device region to remove the cap layer 143 (if containing p-type dopants) from the exposed surfaces of the first semiconductor layers 106. The S/D features 146 may be formed using selective epitaxial growth (SEG), CVD, ALD, MBE, or any suitable growth process, with a semiconductor material suitable for the device desired to be formed. In one embodiment where the S/D features 146 are utilized to form an NMOS device, the S/D features 146 may be a semiconductor material such as Si, SiP, SiC, SiCP, SiPAs, SiAs, or combinations thereof. Once the S/D features 146 are formed, dopants, such as n-type dopants, may be implanted into the S/D features 146 using the sacrificial gate structures 130 and the gate spacers 138 as masks. After the S/D features 146 have been formed, the S/D features 147 may be formed by removing the protection from the second device region 105 (through, e.g., ashing) and protecting the first device region 103 with a photoresist or other masking material. Once the first device region 103 has been protected, the S/D features 147 may be formed using a semiconductor material such as Si, SiGe, Ge, SiGeC, or combinations thereof. Once the S/D features 147 are formed, dopants, such as p-type dopants, may be implanted into the S/D features 147 using the sacrificial gate structures 130 and the gate spacers 138 as masks. The protection is then removed from the first device region 103.

In some embodiments, which can be combined with any other embodiment(s) of the present disclosure, a facetted structure 148, 149 may be formed on the first semiconductor layers 106 (if no cap layers 143 were present) and the cap layers 143, respectively, to promote epitaxial growth of the S/D features 146, 147. The facetted structures 148, 149 may grow both vertically and horizontally to form facets, which may correspond to crystal planes of the material of the first semiconductor layers 106 and/or the cap layers 143. Due to different growth rates on different surface planes, facets can be formed. For example, during the growth of the facetted structures 148, 149, the growth rate on (111) planes of the first semiconductor layer 106 (e.g., silicon) may be lower than the growth rate on other planes, such as (110) and (100) planes of the first semiconductor layer 106. Therefore, facets are formed as a result of difference in growth rates of the different planes. The facets of the facetted structures 148, 149 can provide increased surface area to promote epitaxial growth of the S/D features 146, 147. Once the facetted structures 148, 149 are formed, the S/D features 146, 147 may grow on the facetted structures 148, 149 and cover the exposed surfaces of the facetted structures 148, 149 in a similar fashion as discussed above.

FIGS. 14A-1 and 14B-1 are enlarged views of a portion of the semiconductor device structure 100, respectively, showing facetted structures 148, 149 in accordance with some embodiments. In one embodiment, the facetted structures 148, 149 have a rhombus-like shape. The facetted structures 148, 149 are formed with at least facets 148a, 148b and 149a, 149b, respectively. The facets 148a-b and 149a-b of the facetted structures 148, 149 provide increased surface area to promote epitaxial growth of the S/D features 146, 147. As can be seen in FIG. 14B-1, each of the first semiconductor layers 106 (i.e., nanostructure channels) has a thickness or height D4, and the cap layer 143 forming around the first semiconductor layers 106 increases the height of the first semiconductor layers 106 from D4 to D5. The increased height D5 of the nanostructure channels provides extended length for the facetted structures 148 to grow thereon and form facets 148a, 148b. As a result, the epitaxial growth rate of the S/D features 147 for the PMOS devices is enhanced.

The facetted structures 148, 149 may include silicon and optionally n-type or p-type dopants, depending on the conductivity type of the S/D features 146, 147 to be grown thereon. For example, the facetted structure 149 at the first device region 103 may be silicon doped with n-type dopants, such as phosphorous or arsenic, and the facetted structure 148 at the second device region 105 may be silicon doped with p-type dopants, such as boron. The facet structures 148, 149 may be formed using selective epitaxial growth (SEG), ALD, MBE, or any suitable growth process. In some embodiments, the facet structures 148, 149 are formed by the same growth process. In such cases, the cap layers 143 or the first semiconductor layers 106 may be exposed to silicon-containing precursor(s) and n-type or p-type dopant-containing precursor(s) in a process chamber to form facetted structure 148 or facetted structure 149. The process conditions of the growth process are configured in accordance with the crystal planes of the cap layer 143 and the first semiconductor layer 106 to promote faceting formation of the facetted structures 148, 149. Once the predetermined volume of the facetted structures 148 or 149 is reached, the flow of the n-type or p-type dopant-containing precursor(s) may be terminated and group IV or group V precursor(s) are introduced into the process chamber along with the silicon-containing precursor(S) to form the S/D features 146, 147, respectively. Therefore, the facetted structures 148, 149 are formed of a material that is chemically different from that of the S/D features 146, 147. The dopants in the S/D features 146, 147 may be added during the formation of the S/D features 146, 147, or after the formation of the S/D features 146, 147 by an implantation process, as discussed previously.

FIG. 14E illustrates a top view of a portion of the semiconductor device structure 100 taken along cross-section E-E of FIG. 14B, in accordance with some embodiments. As can be seen in FIG. 14E, the facetted structure 148 is grown from the cap layer 143, which has extended length D6 (when compared to the length D7 of the first semiconductor layer 106) due to the edge portion of the first semiconductor layers 106 being surrounded by the cap layer 143. The extended length D6 allows greater volume of the facetted structure 148 to form thereon. In one embodiment, the cap layer 143 may include a first portion 143-1 disposed between and in contact with the first semiconductor layer 106 and the facetted structure 148, and at least a second portion 143-2 of the cap layer 143 disposed between and in contact with the cladding layer 117 and the inner spacer 144. A first side of the inner spacer 144 is substantially flat and disposed against the S/D feature 147, and a second side of the inner spacer 144 is curved (has a substantially convex shape, for example) and disposed against the cap layer 143 (e.g., second portion 143-2 of the cap layer 143). It should be noted that the cladding layer 117 will subsequently be removed and replaced with materials from a replacement gate structure 190 (FIG. 18B), such as an interfacial layer (IL) 178, a gate dielectric layer 180, and/or a gate electrode layer 182*b*. Therefore, the second portion 143-2 of the cap layer 143 may in contact with the IL 178 (e.g., FIG. 23-1), the gate dielectric layer 180 (e.g., FIG. 18E), and/or the gate electrode layer 182*b* (e.g., FIG. 18E) in some embodiments.

FIG. 14F illustrates a top view of a portion of the semiconductor device structure 100 taken along cross-section F-F of FIG. 14B, in accordance with some embodiments. In this view, portions of the second semiconductor layers 108 and the cladding layer 117 are recessed since they may include the same material (e.g., SiGe). The removal of the portions of the second semiconductor layers 108 and the cladding layer 117 creates room for the inner spacer 144. In one embodiment, the inner spacer 144 may include a first portion 144-1 disposed between and in contact with the second semiconductor layer 108 and the S/D feature 147, and at least a second portion 144-2 disposed between and in contact with the cladding layer 117 and the S/D feature 147. A first side of the first and second portions 144-1, 144-2 is substantially flat and disposed against the S/D feature 147, and a second side of the first and second portions 144-1, 144-2 curved (has a substantially convex shape, for example). Likewise, the cladding layer 117 and the second semiconductor layer 108 will subsequently be removed and replaced with materials from the replacement gate structure 190, such as the IL 178, the gate dielectric layer 180, and/or the gate electrode layer 182*b*. Therefore, the first portion 144-1 and the second portion 144-2 may be in contact with the IL 178 (e.g., FIG. 23-1), the gate dielectric layer 180 (e.g., FIG. 18E), and/or the gate electrode layer 182*b* in some embodiments (e.g., FIG. 18E).

FIG. 14G illustrates a portion of the semiconductor device structure 100 taken along cross-section E-E of FIG. 14B, in accordance with some alternative embodiments. This embodiment is substantially identical to the embodiment of FIG. 14E except that no facetted structure 148 is formed between the cap layer 143 and the S/D feature 147. Instead, the S/D feature 147 is grown directly from the cap layer 143, which may be pure silicon or boron-doped silicon as those discussed above with respect to FIGS. 8A and 8B. In this embodiment, the cap layer 143 may include a first portion 143-1 disposed between and in contact with the first semiconductor layer 106 and the S/D feature 147, and at least a second portion 143-2 of the cap layer 143 disposed between and in contact with the cladding layer 117 and the inner spacer 144. A first side of the inner spacer 144 is substantially flat and disposed against the S/D feature 147, and a second side of the inner spacer 144 is curved (has a substantially convex shape, for example) and disposed against the cap layer 143 (e.g., second portion 143-2 of the cap layer 143). Likewise, the cladding layer 117 and the second semiconductor layer 108 will subsequently be removed and replaced with materials from the replacement gate structure 190, such as the IL 178, the gate dielectric layer 180, and/or the gate electrode layer 182*b*. Therefore, the first portion 144-1 and the second portion 144-2 may be in contact with the IL 178 (e.g., FIG. 23-1), the gate dielectric layer 180 (e.g., FIG. 18E), and/or the gate electrode layer 182*b* in some embodiments (e.g., FIG. 18E).

In FIGS. 15A-15D, after formation of the S/D features 146, 147, a contact etch stop layer (CESL) 162 is conformally formed on the exposed surfaces of the semiconductor device structure 100. The CESL 162 covers the S/D features 146, 147, the gate spacers 138, and the dielectric material 125 at the first and second device regions 103, 105. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique.

Once the ILD layer 164 has been formed, a planarization operation, such as CMP, is performed on the semiconductor device structure 100 to remove portions of the ILD layer 164, the CESL 162, the mask layer 136 until the sacrificial gate electrode layer 134 is exposed.

In FIGS. 16A-16D, the sacrificial gate structure 130, the cladding layer 117, and the second semiconductor layers 108 are removed from the semiconductor device structure 100 at the first and second device regions 103, 105. The removal of the sacrificial gate structure 130 and the semiconductor layers 108 forms an opening 166 between gate spacers 138 and between first semiconductor layers 106. The ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162. In some embodiments, the gate spacers 138 may be recessed by the etchant used to remove the sacrificial gate electrode layer 134 and/or the sacrificial gate dielectric layer 132.

After the removal of the sacrificial gate structure 130, the cladding layers 117 and the second semiconductor layers 108 are exposed. The removal of the cladding layers 117 and the second semiconductor layers 108 exposes the cap layer 143 and the first semiconductor layers 106. The cap layer 143 avoids or minimizes the damage to the inner spacers 144 during removal of the cladding layers 117 and the second semiconductor layers 108, thereby protecting the integrality of the S/D features 146, 147. The removal process may be any suitable etch processes, such as dry etch, wet etch, or a combination thereof. The etch process may use an etchant that selectively removes the cladding layers 117 and the second semiconductor layers 108 without substantially removing the gate spacers 138, the ILD layer 164, the CESL 162, the dielectric material 125, the first semiconductor layers 106, and the cap layer 143. In one embodiment where the first semiconductor layers 106 is Si and the second semiconductor layers 108 is SiGe, the etchant may be a hydrochloric acid (HCl) or any suitable etchant. As a result, a portion of the first semiconductor layers 106 not covered by the cap layer 143 is exposed in the opening 166.

Figures 17A, 17B:
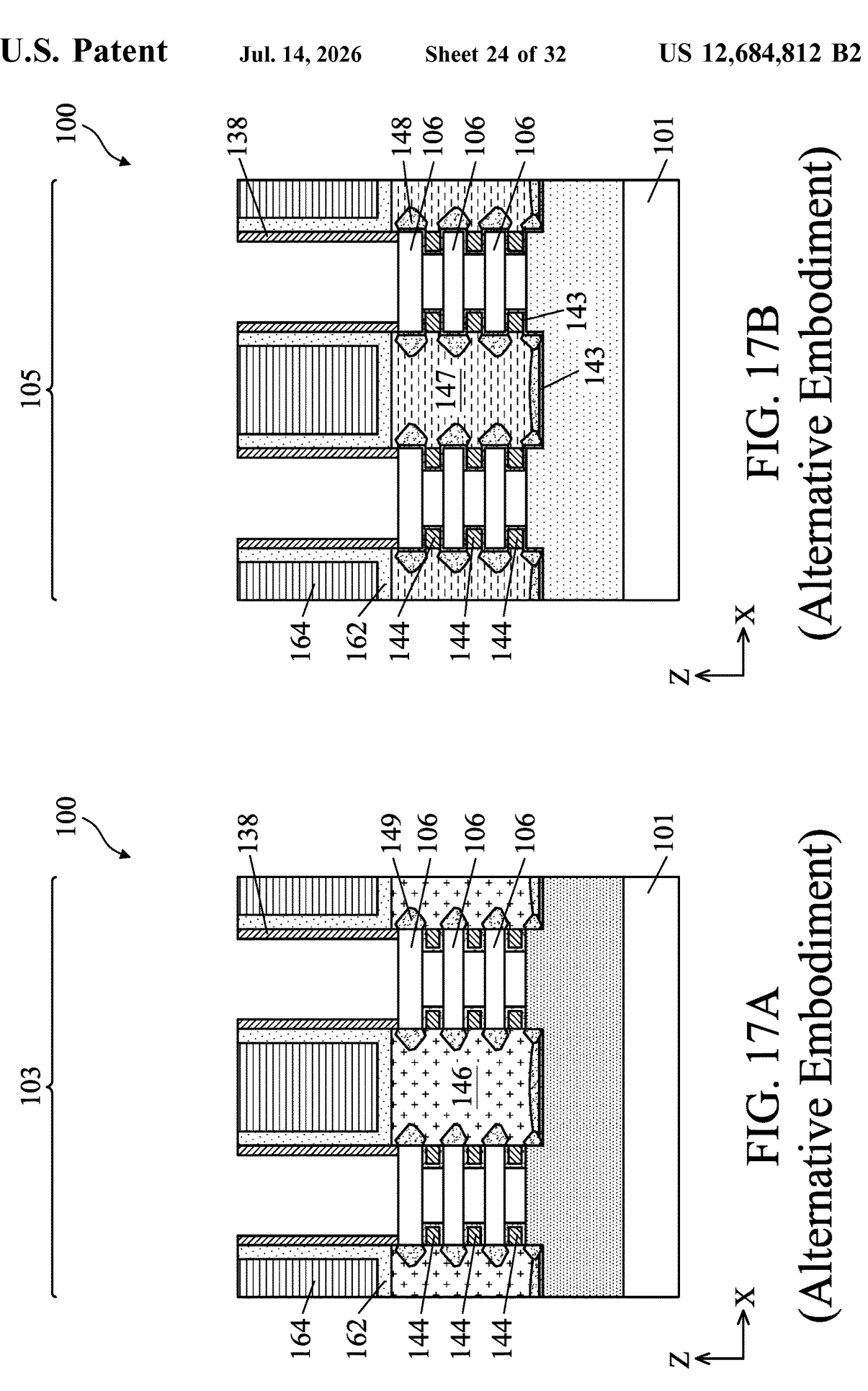

In some alternative embodiments shown in FIGS. 17A and 17B, which can be combined with any other embodiments of this disclosure, the exposed portions of the cap layer 143 may be further etched after the cladding layers 117 and the second semiconductor layers 108 are removed. The cap layer 143 may be etched using any suitable process, such as wet oxidation process or selective dry and/or wet etch process that selectively removes the cap layer 143 without substantially removing the gate spacers 138, the ILD layer 164, the CESL 162, the dielectric material 125, and the first semiconductor layers 106.

Figure 18B:
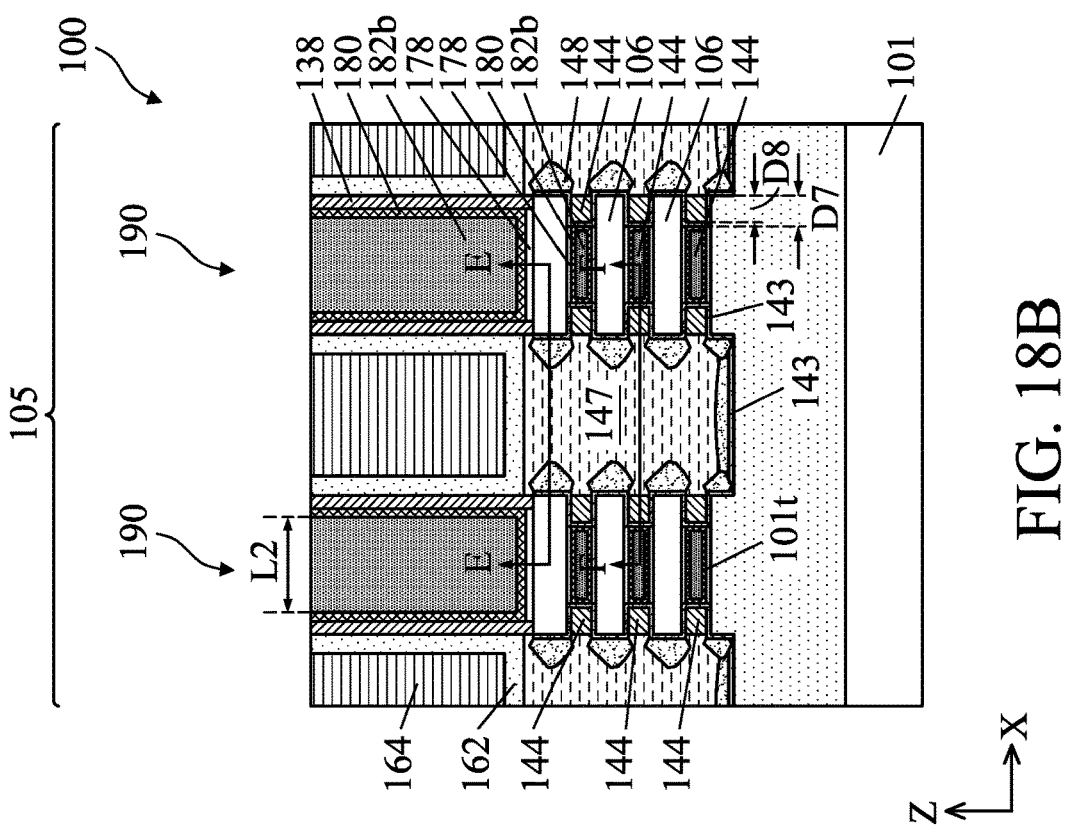
Figure 18A:
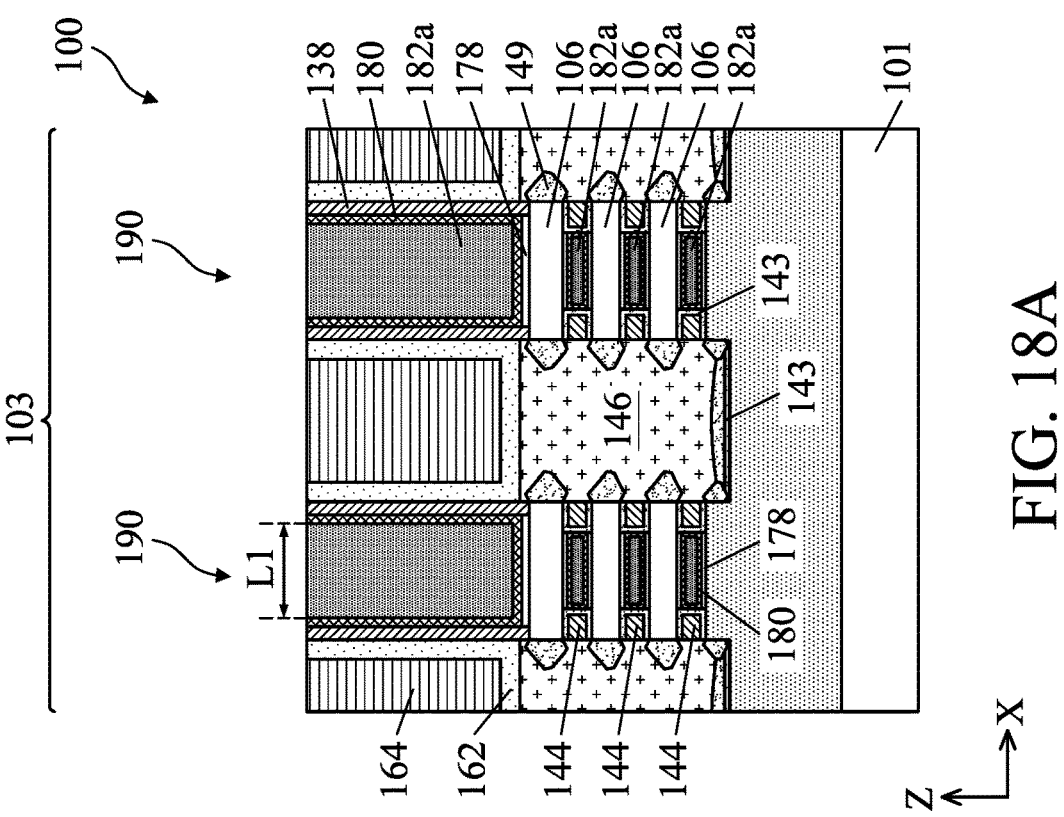
Figure 18D:
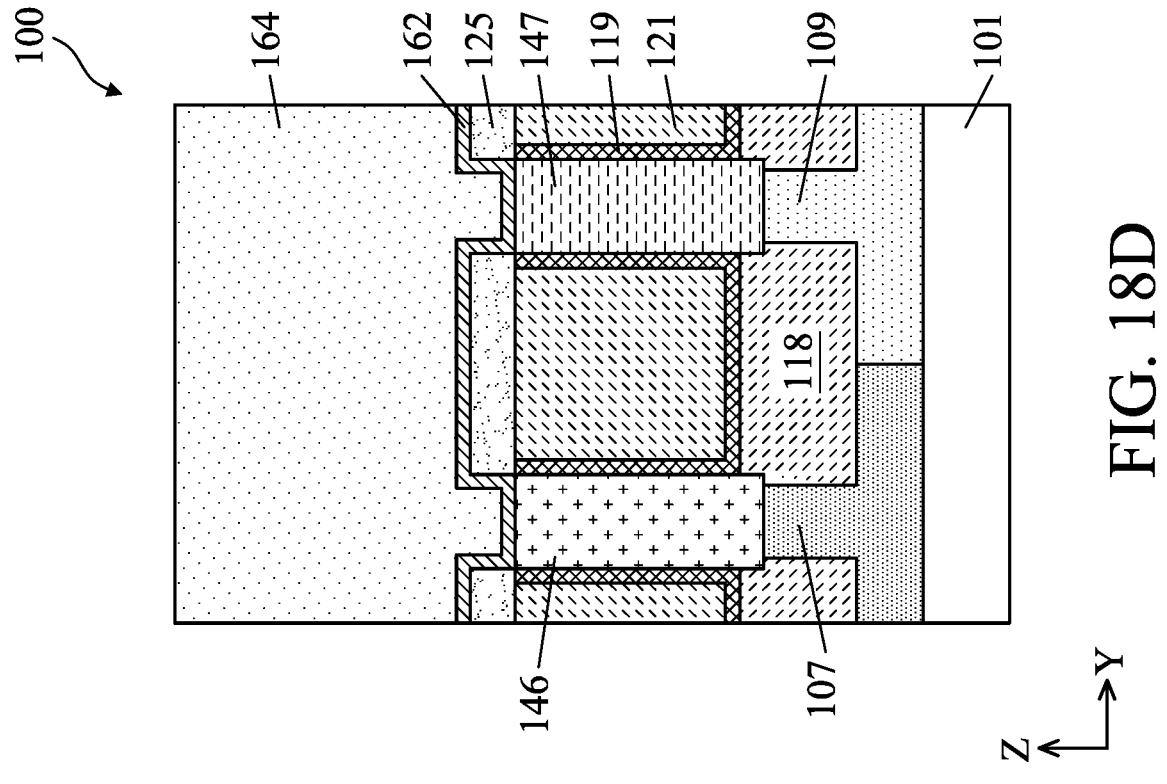
Figure 18C:
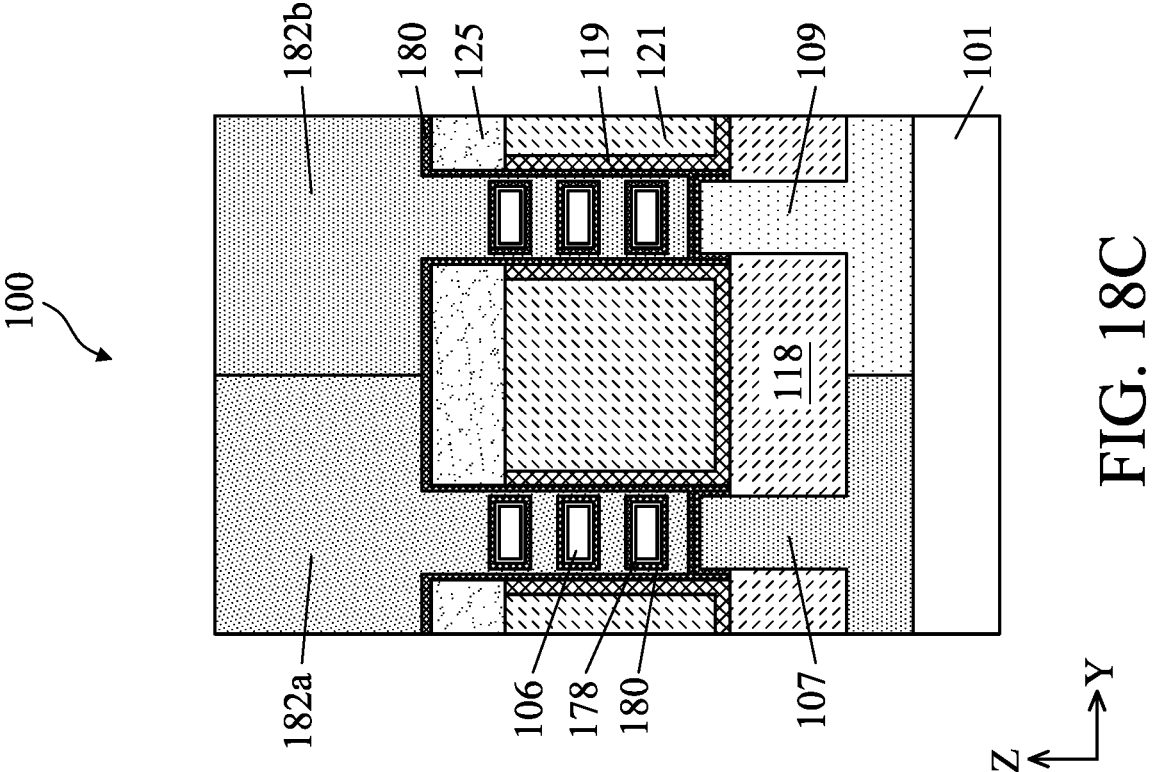

In FIGS. 18A-18D, replacement gate structures 190 are formed in the region provided by removal of the cladding layers 117 and the second semiconductor layers 108 at the first and second device regions 103, 105. The replacement gate structures 190 each includes an interfacial layer (IL) 178, a gate dielectric layer 180, and a gate electrode layer 182a/182b. The interfacial layer (IL) 178 is formed to surround exposed surfaces of the first semiconductor layers 106. The IL 178 may also form on the exposed wells 107, 109 of the substrate 101. The IL 178 may include or be made of an oxygen-containing material or a silicon-containing material, such as silicon oxide, silicon oxynitride, oxynitride, hafnium silicate, etc. In one embodiment, the IL 178 is silicon oxide. The IL 178 may be formed by CVD, ALD, a clean process, or any suitable process. Next, the gate dielectric layer 180 is formed on the exposed surfaces of the semiconductor device structure 100. Portions of the IL 178 and the gate dielectric layer 180 are in contact with the cap layer 143. In some embodiments, the gate dielectric layer 180 is formed to wrap around and in contact with the IL 178. The gate dielectric layer 180 also forms on and in contact with the liner 119 and the dielectric material 125 (FIGS. 18C and 18D). The gate dielectric layer 180 may include or made of a high-k dielectric material, such as hafnium oxide $(HfO_2)$, hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide $(Al_2O_3)$, aluminum silicon oxide (AlSiO), zirconium oxide (ZrO), titanium oxide (TiO), tantalum oxide $(Ta_2O_5)$, yttrium oxide $(Y_2O_3)$, silicon oxynitride (SiON), oxide with nitrogen doped dielectrics combined with metal content high-k dielectric (having a k value>13), or other suitable dielectrics having a k value≥9. The gate dielectric layer 180 may be a conformal layer formed by a conformal process, such as an ALD process or a CVD process. The gate dielectric layer 180 may have a thickness in a range of about 0.5 nm to about 3 nm.

After formation of the IL 178 and the gate dielectric layer 180, the gate electrode layer 182a/182b is formed on the gate dielectric layer 180. The gate electrode layer 182a may be formed to fill the openings 166 (FIGS. 16A and 16B) and surround a portion of each of the first semiconductor layers 106 at the first device region 103. The gate electrode layer 182b may be formed to fill the openings 166 and surround a portion of each of the first semiconductor layers 106 at the second device region 105. In some embodiments, the gate electrode layers 182a, 182b may be formed using multiple layers, each layer deposited sequentially adjacent to each other using a highly conformal deposition process such as ALD. Other deposition technique such as PVD, CVD, or electro-plating may also be used. While not shown, the gate electrode layer 182a may include a capping layer, a barrier layer, an n-metal work function layer, a p-metal work function layer, and a fill material. The capping layer and the barrier layer may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed of a material different from the capping layer. The n-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium acuminate, combinations of these, or the like. Once the n-metal work function layer and the p-metal work function layer are formed, the fill material is deposited to fill a remainder of the opening 166. The fill material may be a material such as W, Al, Cu, AlCu, W, Ti, TiAlN, TaC, TaCN, TaSiN, Mn, Zr, TiN, Ta, TaN, Co, Ni, combinations of these, or the like.

Similarly, the gate electrode layer 182b may be formed using multiple layers and materials similar to the gate electrode layer 182a discussed above. In some embodiments, one or more of the layers within the gate electrode layer 182a and the gate electrode layer 182b may be formed during a same series of steps. For example, the capping layers and the barrier layers in both of the gate electrode layer 182a and the gate electrode layer 182b may be formed simultaneously, while other layers such as the n-metal work function layer and the p-metal work function layer may be formed and/or patterned independently of each other. Any suitable combination of depositions and removals may be utilized to form the gate electrode layer 182a and the gate electrode layer 182b.

Once the openings 166 have been filled, the materials of the gate electrode layer 182a and the gate electrode layer 182b may be planarized by a planarization process (e.g., CMP) to remove any material that is outside of the openings left behind by the removal of the sacrificial gate electrode layer 134.

As such, the cap layer 143 and the inner spacer 144 between the gate dielectric layer 180 and the S/D feature 147 have a combined thickness D7 in a range of about 2 nm to about 8 nm, such as about 4 nm to about 5 nm. The inner spacer 144 may have a uniform thickness D8 (along the X direction) of about 0.5 nm to about 1.5 nm. The length L1 of the gate electrode layer 182a may be in a range of about 3 nm to about 30 nm. The length L2 of the gate electrode layer 182b may be in a range of about 3 nm to about 30 nm. The length L1 may be equal to or less than the length L2.

Figures 18E, 18F, 18G:
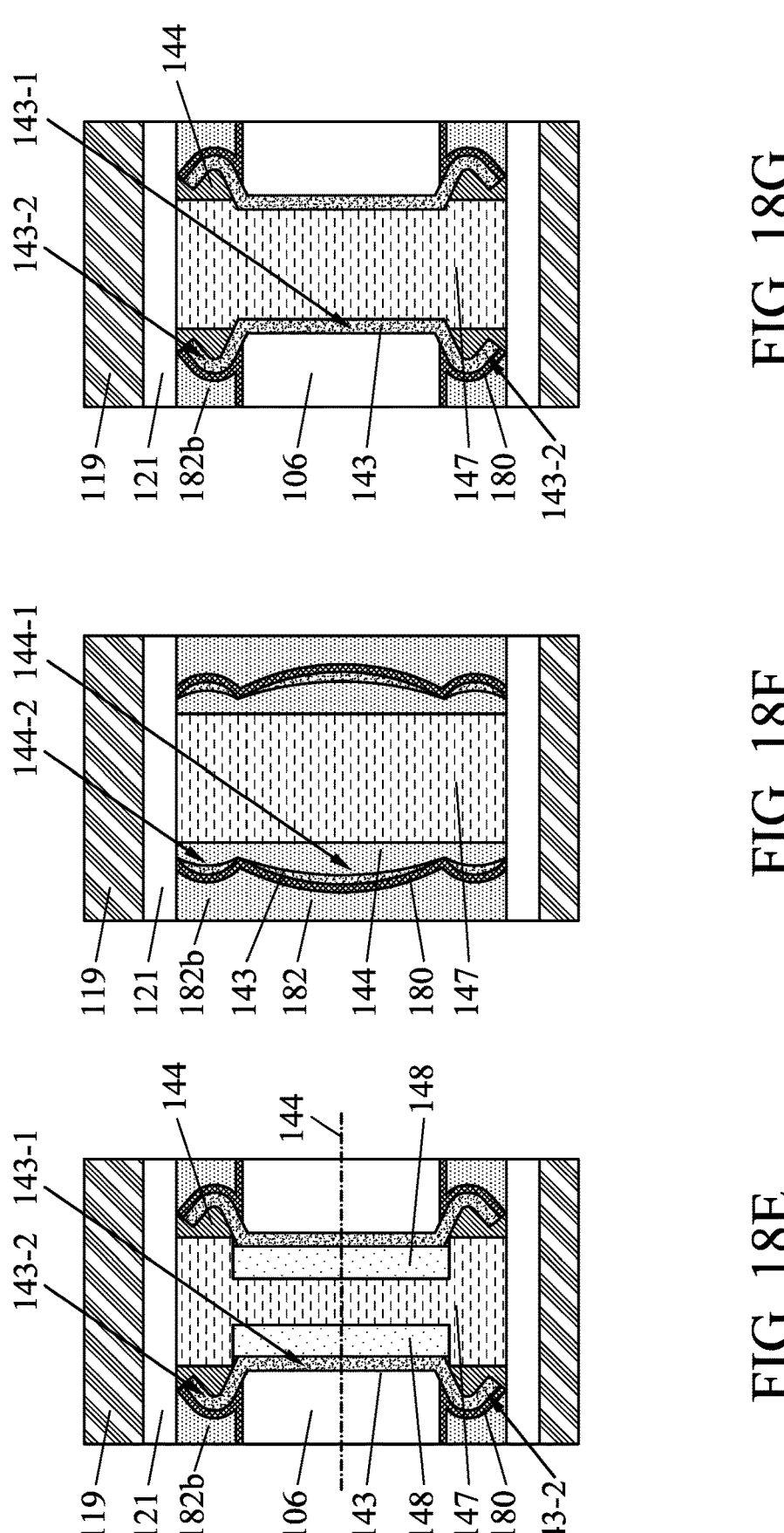
FIG. 18E illustrates a top view of a portion of the semiconductor device structure taken along cross-section E-E of FIG. 18B, in accordance with some embodiments.
FIG. 18F illustrates a top view of a portion of the semiconductor device structure taken along cross-section F-F of FIG. 18B, in accordance with some embodiments.
FIG. 18G illustrates a portion of the semiconductor device structure taken along cross-section E-E of FIG. 18B, in accordance with some alternative embodiments.

FIG. 18E illustrates a top view of a portion of the semiconductor device structure 100 taken along cross-section E-E of FIG. 18B, in accordance with some embodiments. As can be seen in FIG. 18E, the cap layer 143 includes the first portion 143-1 disposed between and in contact with the first semiconductor layer 106 and the facetted structure 148, and the second portion 143-2 extending radially and outwardly from opposing ends of the first portion 143-1. The second portion 143-2 has a curved shape (e.g., convex shape) formed in accordance with the profile of the inner spacer 144. The second portion 143-2 is disposed between and in contact with the inner spacer 144 and the gate dielectric layer 180 contacting the gate electrode layer 182*b*. In some embodiments, a portion of the second portion 143-2 may also be in contact with the first semiconductor layer 106 and the dielectric material 121.

FIG. 18F illustrates a top view of a portion of the semiconductor device structure 100 taken along cross-section F-F of FIG. 18B, in accordance with some embodiments. As can be seen in FIG. 18F, the inner spacer 144 includes the first portion 144-1 and the second portion 144-2 extending from opposing ends of the first portion 144-1. Each of the first and second portions 144-1, 144-2 has a first side that is substantially flat and disposed against the S/D feature 147, and a second side that has a curved profile (e.g., convex shape) and disposed against the gate dielectric layer 180. In some embodiments, the first portion 144-1 has a first radius of curvature and the second portion 144-2 has a first radius of curvature greater than the first radius of curvature. The gate dielectric layer 180 is further in contact with the dielectric material 121.

FIG. 18G illustrates a portion of the semiconductor device structure 100 taken along cross-section E-E of FIG. 18B, in accordance with some alternative embodiments. This embodiment is substantially identical to the embodiment of FIG. 18E except that no facetted structure 148 is formed between the cap layer 143 (e.g., the first portion 143-1) and the S/D feature 147. In other words, the first portion 143-1 of the cap layer 143 is disposed between and in contact with the first semiconductor layer 106 and the S/D feature 147.

Figures 19A, 19B:
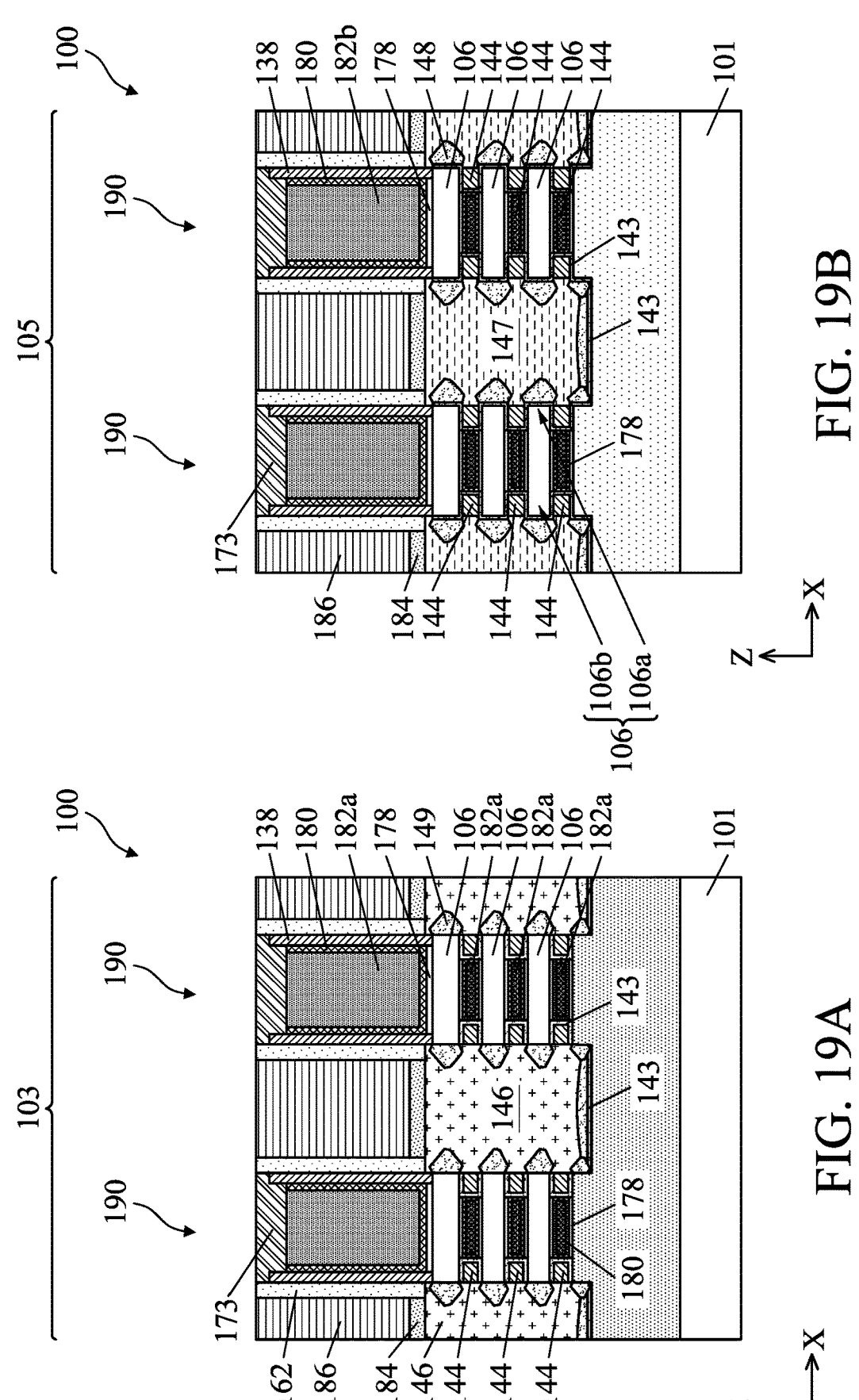
Figure 19D:
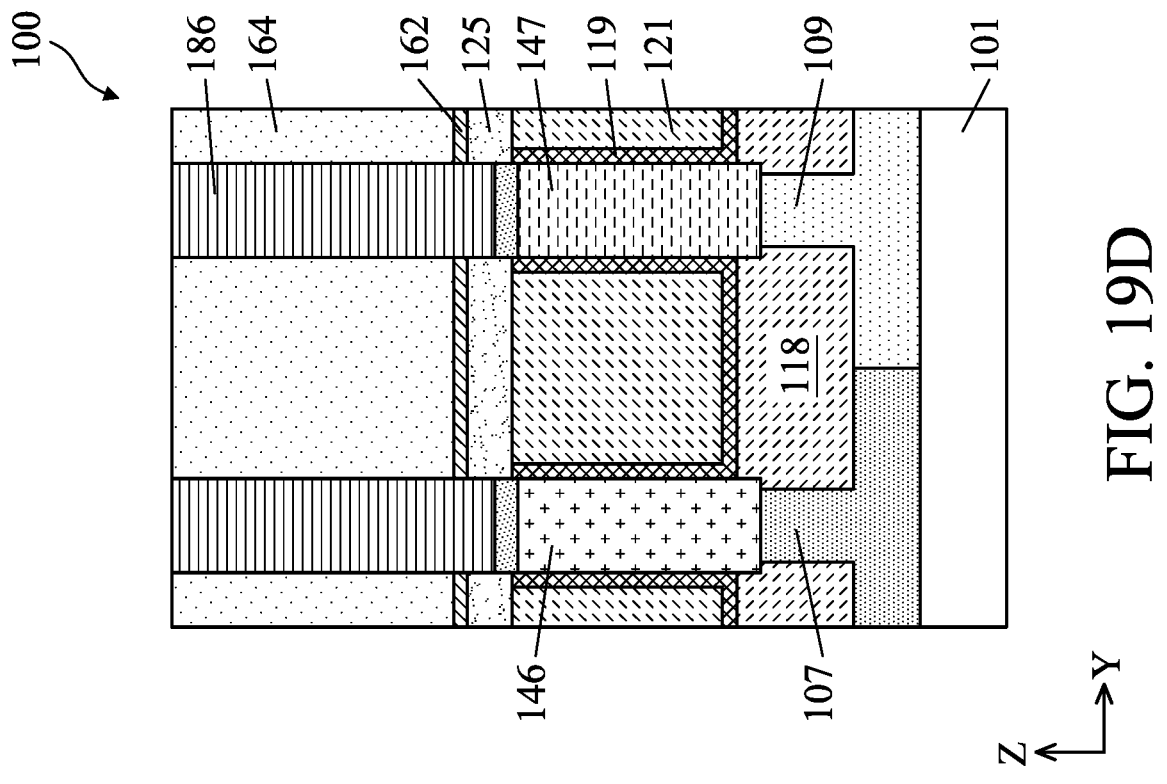
Figure 19C:
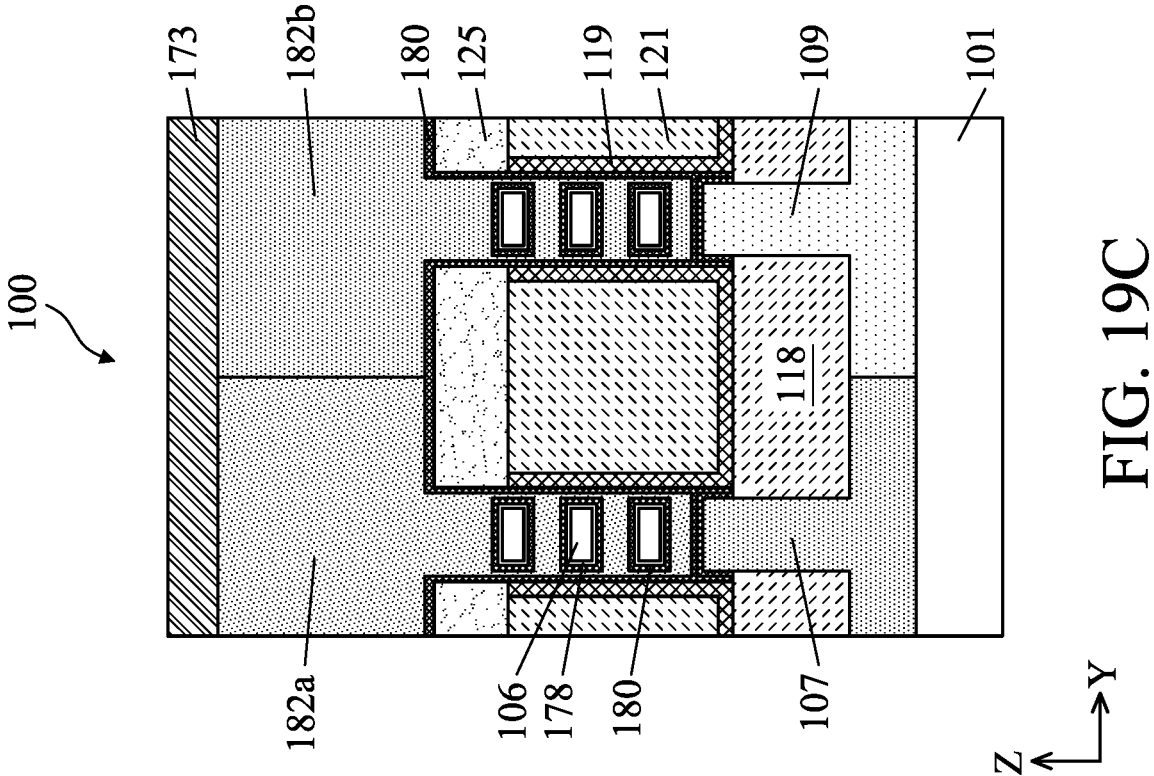

In FIGS. 19A-19D, the gate electrode layer 182*a*, 182*b* may be subject to one or more metal gate etching back (MGEB) processes. The MGEB processes are performed so that the top surfaces of the gate electrode layer 182*a*, 182*b* and the gate dielectric layer 180 are recessed to a level below the top surface of the gate spacers 138. In some embodiments, the gate spacers 138 are also recessed to a level below the top surface of the ILD layer 164, as shown in FIGS. 19A and 19B. A self-aligned contact layer 173 is formed over the gate electrode layer 182*a*, 182*b* and the gate dielectric layer 180 between the gate spacers 138. The self-aligned contact layer 173 may be a dielectric material having an etch selectivity relative to the ILD layer 164. In some embodiments, the self-aligned contact layer 173 may be a dielectric material such as silicon nitride or a high-k dielectric layer. Once formed, the self-aligned contact layer 173 may be planarized using a planarization process such as a CMP.

After formation of the self-aligned contact layer 173, contact openings are formed through the ILD layer 164 and the CESL 162 to expose the epitaxial S/D feature 146, 147. A silicide layer 184 is then formed on the S/D epitaxial feature 146, 147, and a contact 186 is formed in the contact opening on the silicide layer 184. The contact 186 may include an electrically conductive material, such as Al, Cu, W, Co, Ti, Ta, Ru, TiN, TiAl, TiAlN, TaN, TaC, NiSi, CoSi, combinations of these, or the like. The silicidation may be performed by blanket deposition of an appropriate metal layer, followed by an annealing step which causes the metal to react with the underlying exposed silicon. Un-reacted metal is then removed, such as with a selective etch process. The contact 186 may be formed in the contact openings using sputtering, CVD, electroplating, electroless plating, or the like, to fill and/or overfill the contact openings. Any deposited material outside of the contact openings may be removed using a planarization process, such as a CMP.

The semiconductor device structure 100 may then undergo further complementary metal oxide semiconductor (CMOS) and/or back-end-of-line (BEOL) processes to form various features such as transistors, contacts/vias, interconnect metal layers, dielectric layers, passivation layers, etc.

Figures 20, 21:
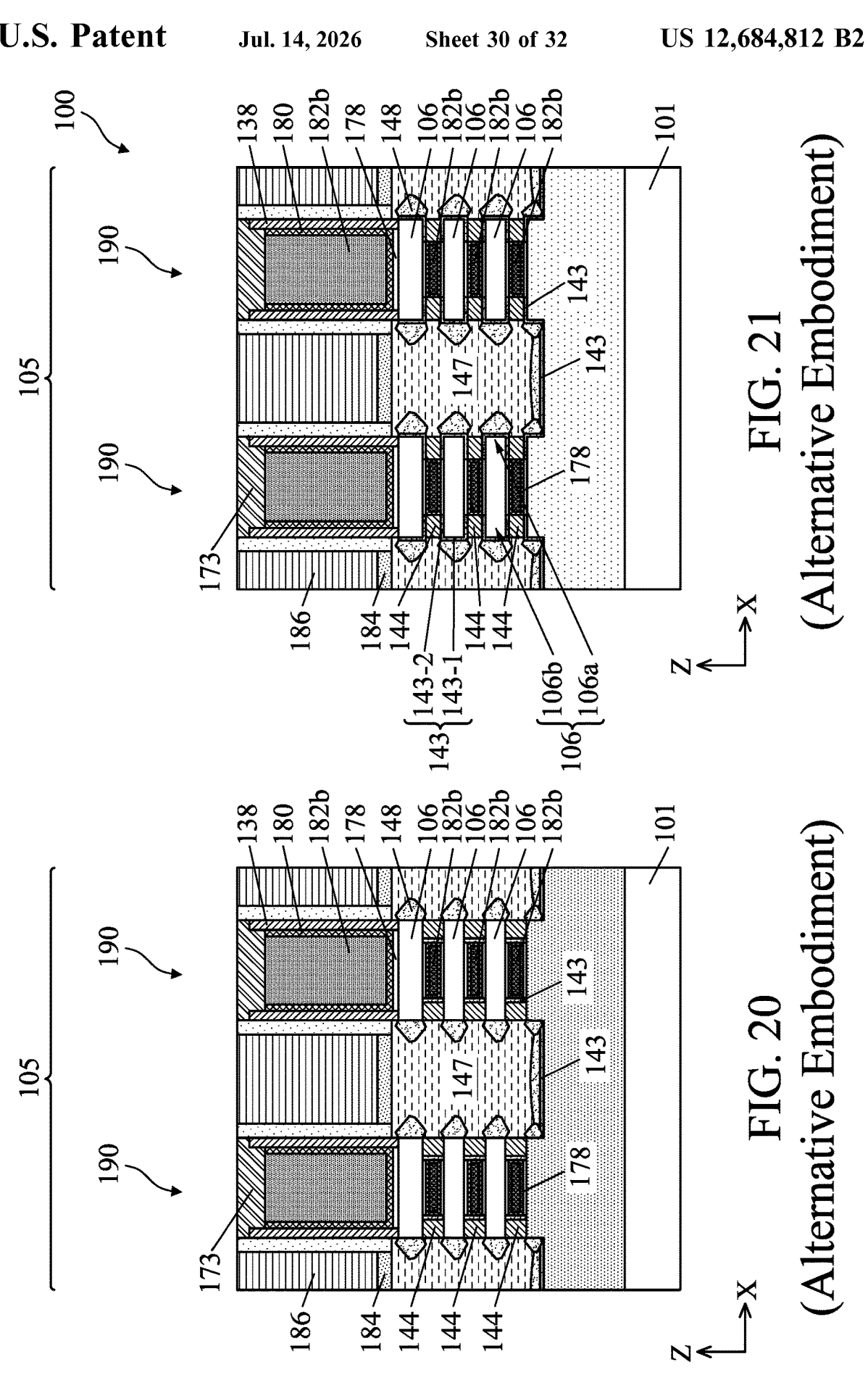
FIGS. 20-23 depict cross-sectional side views of the semiconductor device structure taken along cross-section B-B of FIG. 5, in accordance with some alternative embodiments.

FIGS. 20-23 depict cross-sectional side views of the semiconductor device structure 100 taken along cross-section B-B of FIG. 5, in accordance with some alternative embodiments. These alternative embodiments can be combined with any one or more embodiments of this disclosure. The embodiment in FIG. 20 is based on the embodiment shown in FIG. 13B. As can be seen, each of the facetted structures 148 is in contact with the first semiconductor layer 106 and the S/D feature 147, and the inner spacer 144 is disposed between and in contact with the cap layer 143 and the S/D feature 147.

The embodiment in FIG. 21 is based on the embodiment shown in FIG. 17B. As can be seen, the cap layer 143 is a C-shape or U-shaped structure surrounding edge portions 106*a*, 106*b* of the first semiconductor layers 106. Particularly, the cap layer 143 has a first portion 143-1 extending along the Z direction and a second portion 143-2 extending along the X direction from the first portion 143-1. The first portion 143-1 is disposed between and in contact with the first semiconductor layer 106 and the facetted structure 148, and the second portion 143-2 is disposed between and in contact with the first semiconductor layer 106 and the inner spacer 144. The first portion 143-1 is also in contact with the S/D feature 147.

Figures 1, 22:
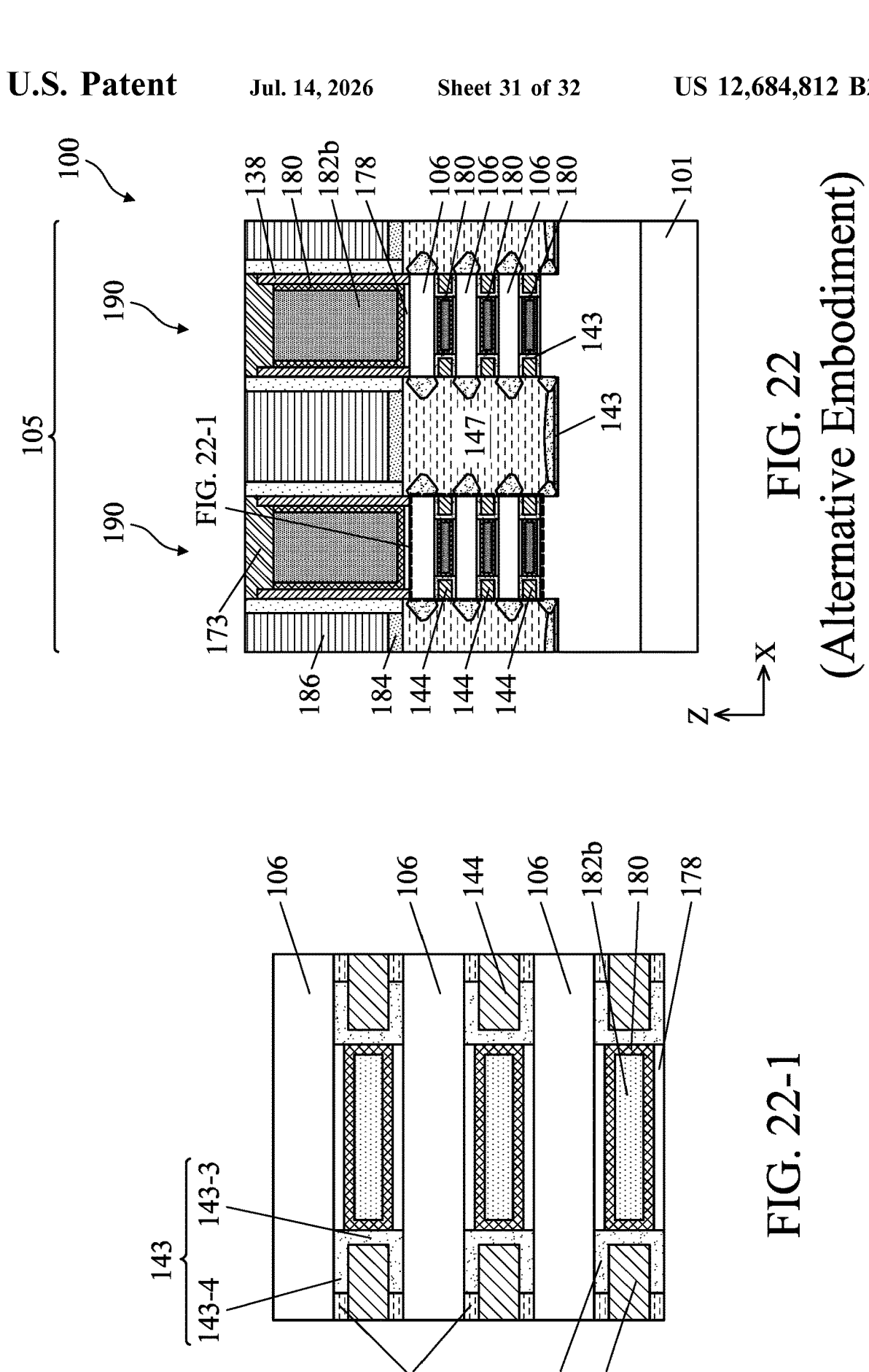

The embodiment in FIG. 22 is based on the embodiment shown in FIG. 11B-1. FIG. 22-1 is an enlarged view of a portion of the semiconductor device structure 100 shown in FIG. 22. As can be seen, the cap layer 143 is a C-shape or U-shaped structure surrounding an end of the inner spacer 144. Particularly, the cap layer 143 has a first portion 143-3 extending along the Z direction and a second portion 143-4 extending along the X direction from the first portion 143-3. The first portion 143-3 is disposed between and in contact with the inner spacer 144 and the gate dielectric layer 180. In some embodiments, the first portion 143-3 is further in contact with the IL 178 and the first semiconductor layer 106. Likewise, the second portion 143-4 is disposed between and in contact with the inner spacer 144 and the first semiconductor layer 106. In some embodiments, the second portion 143-4 is further in contact with a portion of the S/D feature 147, which is disposed between and in contact with the inner spacer 144 and the first semiconductor layer 106.

Figures 1, 23:
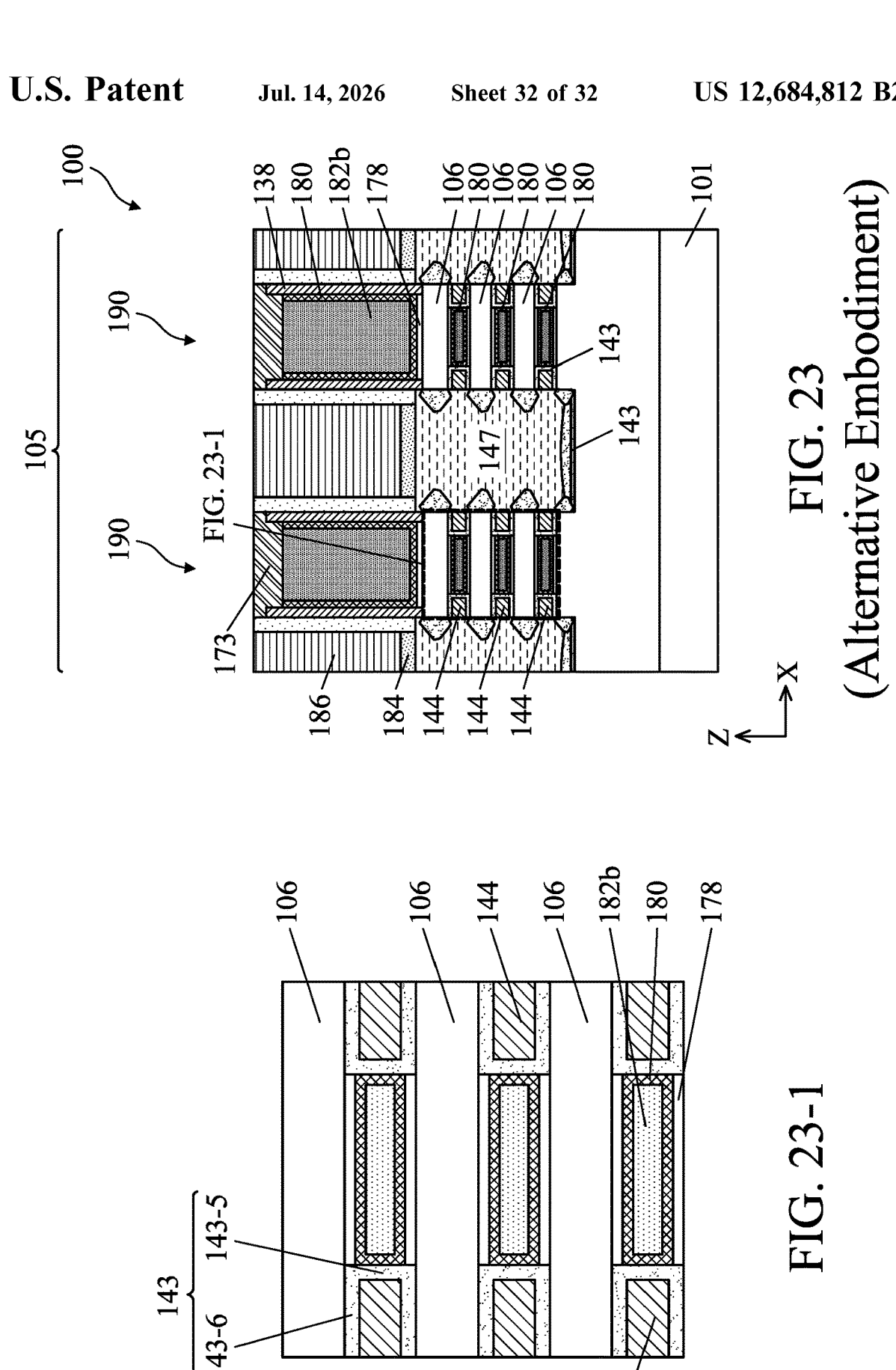

The embodiment in FIG. 23 is based on the embodiment shown in FIG. 14A-1. FIG. 23-1 is an enlarged view of a portion of the semiconductor device structure 100 shown in FIG. 23. As can be seen, the cap layer 143 is a C-shape or U-shaped structure surrounding at least three sides of the inner spacer 144. Particularly, the cap layer 143 has a first portion 143-5 extending along the Z direction and a second portion 143-6 extending along the X direction from the first portion 143-5. The first portion 143-5 is disposed between and in contact with the inner spacer 144 and the gate dielectric layer 180. The first portion 143-5 is further in contact with the IL 178 and the first semiconductor layer 106. The second portion 143-6 is disposed between and in contact with the inner spacer 144 and the first semiconductor layer 106.

Various embodiments or examples described herein offer multiple advantages over the state-of-art technology. According to embodiments of the present disclosure, wire release induced damages to S/D features of nanostructure channel FETs can be prevented by providing a cap layer between inner spacers and the nanostructure channels. The cap layer may be high-k dielectrics, doped (e.g., Si:B) or undoped silicon (e.g., pure silicon). The cap layer can effectively retard etchant chemicals used during nanostructure formation process, thereby protecting the integrality of the S/D features. The cap layer increases physical thickness of the inner spacers and help avoid reliability issues (e.g., TDDB). The use of high-k dielectric as the cap layer also reduces parasitic effective capacitance.

An embodiment is a semiconductor device structure. The semiconductor device structure includes a source/drain feature over a substrate, a plurality of semiconductor layers over the substrate, a gate electrode layer surrounding a portion of each of the plurality of the semiconductor layers, a gate dielectric layer in contact with the gate electrode layer, and a cap layer. The cap layer has a first portion disposed between the plurality of semiconductor layers and the source/drain feature and a second portion extending outwardly from opposing ends of the first portion. The semiconductor device structure further includes a dielectric spacer disposed between and in contact with the source/drain feature and the second portion of the cap layer.

Another embodiment is a semiconductor device structure. The semiconductor device structure includes a first source/drain feature formed over a first device region of a substrate, a second source/drain feature formed over the first device region of the substrate, two or more first semiconductor layers disposed parallelly to each other and between the first source/drain feature and the second source/drain feature, a first gate electrode layer surrounding a portion of at least one of two or more first semiconductor layers, a first dielectric spacer disposed between two adjacent first semiconductor layers, the first dielectric spacer being in contact with the first source/drain feature, and a first cap layer surrounding an edge portion of at least one of the two or more first semiconductor layers.

A further embodiment is a method for forming a semiconductor device structure. The method includes forming a stack of semiconductor layers over a substrate, the stack of the semiconductor layers comprising a plurality of first semiconductor layers and a plurality of second semiconductor layers alternatingly stacked, forming a fin structure from the stack of the semiconductor layers and the substrate, forming a sacrificial gate structure over a portion of the fin structure, removing portions of the fin structure not covered by the sacrificial gate structure to expose a portion of the substrate, removing edge portions of the second semiconductor layers to form cavities between adjacent first semiconductor layers, forming a cap layer on exposed surfaces of each of the first and second semiconductor layers, forming a dielectric spacer on the cap layer and filling in the cavities, forming a source/drain feature on opposite sides of the sacrificial gate structure, the source/drain feature being in contact with the dielectric spacer, removing the sacrificial gate structure and the plurality of second semiconductor layers to expose portions of the plurality of first semiconductor layers and the cap layer, and forming a gate electrode layer to surround the exposed portion of at least one of the plurality of first semiconductor layers, wherein the gate electrode layer is separated from the dielectric spacer by the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

forming a stack of semiconductor layers over a substrate, the stack of the semiconductor layers comprising a plurality of first semiconductor layers and a plurality of second semiconductor layers alternatingly stacked;

forming a fin structure from the stack of the semiconductor layers and the substrate;

forming a sacrificial gate structure over a portion of the fin structure;

removing portions of the fin structure not covered by the sacrificial gate structure to expose a portion of the substrate;

removing edge portions of the second semiconductor layers to form cavities between adjacent first semiconductor layers;

forming a cap layer on exposed surfaces of each of the first and second semiconductor layers, wherein the cap layer is formed of a semiconductor material;

forming a dielectric spacer on the cap layer and filling in the cavities;

after forming the dielectric spacer, forming a facetted structure on entire exposed surfaces of the cap layer;

forming a source/drain feature on opposite sides of the sacrificial gate structure, the source/drain feature being in contact with the dielectric spacer and the facetted structure;

removing the sacrificial gate structure and the plurality of second semiconductor layers to expose portions of the plurality of first semiconductor layers and the cap layer; and forming a gate electrode layer to surround the exposed portion of at least one of the plurality of first semiconductor layers, wherein the gate electrode layer is separated from the dielectric spacer by the cap layer.

2. The method of claim 1, further comprising:

after forming a cap layer on entire exposed surfaces of each of the first and second semiconductor layers, selectively removing the cap layer from the exposed surfaces of the first semiconductor layers in an N-type region while keeping the cap layer on the exposed surfaces of the first semiconductor layers in a P-type region.

3. The method of claim 1, wherein the cap layer is a boron-doped silicon.

4. A method for forming a semiconductor device structure, comprising:

forming a sacrificial gate structure over a portion of a fin structure, the fin structure comprising a plurality of first semiconductor layers and a plurality of second semiconductor layers alternatingly stacked;

removing portions of the fin structure not covered by the sacrificial gate structure;

removing edge portions of the second semiconductor layers to form cavities between adjacent first semiconductor layers;

forming a cap layer on exposed surfaces of the sacrificial gate structure and each of the first and second semiconductor layers;

forming a dielectric spacer on the cap layer and filling in the cavities;

after forming the dielectric spacer, removing the cap layer on exposed surfaces of the sacrificial gate structure;

after removing the cap layer on exposed surfaces of the sacrificial gate structure, forming a facetted structure on entire surface of the cap layer; and forming a source/drain feature on opposite sides of the sacrificial gate structure, the source/drain feature being in contact with the facetted structure and the dielectric spacer.

5. The method of claim 4, further comprising:

removing the sacrificial gate structure and the plurality of second semiconductor layers to expose portions of the plurality of first semiconductor layers and the cap layer; and forming a gate electrode layer to surround the exposed portion of at least one of the plurality of first semiconductor layers.

6. The method of claim 4, wherein the facetted structure is formed on the entire exposed surfaces of the cap layer.

7. The method of claim 4, wherein the cap layer is formed of a doped semiconductor.

8. The method of claim 7, wherein the cap layer is a boron-doped silicon.

9. The method of claim 4, wherein the cap layer is formed of an oxide-based dielectric, nitride-based dielectric, carbon-based dielectric, or a high-K dielectric.

10. The method of claim 4, further comprising:

after removing the cap layer on exposed surfaces of the sacrificial gate structure, selectively removing the cap layer from the exposed surfaces of the first semiconductor layers in an N-type region while keeping the cap layer on the exposed surfaces of the first semiconductor layers in a P-type region.

11. A method for forming a semiconductor device structure, comprising:

forming a sacrificial gate structure over a portion of a fin structure, the fin structure comprising a plurality of first semiconductor layers and a plurality of second semiconductor layers alternatingly stacked;

removing portions of the fin structure not covered by the sacrificial gate structure;

removing edge portions of the second semiconductor layers to form cavities between adjacent first semiconductor layers;

forming a cap layer on exposed surfaces of the sacrificial gate structure and each of the first and second semiconductor layers, wherein the cap layer is formed of a doped semiconductor;

forming a dielectric spacer on the cap layer and filling in the cavities, wherein the dielectric spacer is formed of a material chemically different than the doped semiconductor;

after forming the dielectric spacer, removing the cap layer on the exposed surfaces of the sacrificial gate structure;

forming a facetted structure on exposed surfaces of the cap layer; and forming a source/drain feature on opposite sides of the sacrificial gate structure, the source/drain feature being in contact with the facetted structure and the dielectric spacer.

12. The method of claim 11, wherein the doped semiconductor is boron-doped silicon.

13. The method of claim 12, wherein the boron concentration is in a range from about zero to about 3E21 cm$^{-3}$.

14. The method of claim 11, further comprising:

after removing the cap layer on the exposed surfaces of the sacrificial gate structure and the first semiconductor layers, removing a portion of the cap layer between the first semiconductor layers.

15. The method of claim 14, wherein a portion of the source/drain feature is disposed between and in contact with dielectric spacer and a portion of the first semiconductor layer.

16. The method of claim 11, further comprising:

after forming the source/drain feature, removing the sacrificial gate structure and the plurality of second semiconductor layers to expose portions of the plurality of first semiconductor layers and the cap layer; and forming a gate electrode layer to surround the exposed portion of at least one of the plurality of first semiconductor layers.

17. The method of claim 16, further comprising:

prior to forming the gate electrode layer, removing the exposed portions of the cap layer.

* * * * *